United States Patent
Tsutsui

(10) Patent No.: US 12,327,186 B2
(45) Date of Patent: Jun. 10, 2025

(54) ABNORMALITY DETECTING DEVICE AND ABNORMALITY DETECTING METHOD

(71) Applicant: Tokyo Electron Limited, Tokyo (JP)

(72) Inventor: Takuro Tsutsui, Hokkaido (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1046 days.

(21) Appl. No.: 17/105,757

(22) Filed: Nov. 27, 2020

(65) Prior Publication Data

US 2021/0166120 A1     Jun. 3, 2021

(30) Foreign Application Priority Data

Nov. 29, 2019    (JP) ................. 2019-217438

(51) Int. Cl.
    *G06N 20/00*     (2019.01)
    *G01N 21/95*     (2006.01)
    *G06N 3/08*     (2023.01)
    *H01L 21/67*     (2006.01)

(52) U.S. Cl.
    CPC ............ *G06N 3/08* (2013.01); *G01N 21/9501* (2013.01); *H01L 21/67253* (2013.01)

(58) Field of Classification Search
    CPC ....................................................... G06N 3/08
    See application file for complete search history.

(56) References Cited

U.S. PATENT DOCUMENTS

| | | | |
|---|---|---|---|
| 8,972,029 B2 | 3/2015 | Pannese | |
| 8,972,222 B2* | 3/2015 | Kumagae | G05B 23/0275 |
| | | | 702/186 |
| 9,299,542 B2 | 3/2016 | Jung | |
| 10,402,691 B1* | 9/2019 | Abdi Taghi Abad | ............ |
| | | | G06F 18/2431 |
| 11,281,969 B1* | 3/2022 | Rangapuram | G06N 7/01 |
| 2005/0288812 A1* | 12/2005 | Cheng | G05B 19/41875 |
| | | | 700/109 |
| 2008/0155446 A1* | 6/2008 | Pannese | G06T 7/0004 |
| | | | 715/772 |
| 2012/0310864 A1* | 12/2012 | Chakraborty | G06V 10/776 |
| | | | 706/12 |

(Continued)

FOREIGN PATENT DOCUMENTS

| | | |
|---|---|---|
| JP | 6-37021 A | 2/1994 |
| JP | 2005-328001 A | 11/2005 |

(Continued)

OTHER PUBLICATIONS

Gong et al, "Memorizing Normality to Detect Anomaly: Memory-augmented Deep Autoencoder for Unsupervised Anomaly Detection", Aug. 6, 2019. (Year: 2019).*

(Continued)

*Primary Examiner* — Hien L Duong
(74) *Attorney, Agent, or Firm* — XSENSUS LLP

(57) ABSTRACT

An abnormality detection device trains a model using multiple network sections each configured to process acquired time series data sets and a concatenation section configured to combine output data output from each of the multiple network sections and to output, as a combined result, a result of combining the output data output from each of the multiple network sections. The trained model is then applied to adapt a unit of process performed during manufacture of a processed object.

20 Claims, 22 Drawing Sheets

(56) References Cited

U.S. PATENT DOCUMENTS

| | | | | |
|---|---|---|---|---|
| 2014/0209782 A1* | 7/2014 | Jung | ............... | H01J 37/32972 |
| | | | | 250/206 |
| 2017/0192411 A1* | 7/2017 | Ghadar | ................ | G06N 20/00 |
| 2019/0073566 A1* | 3/2019 | Brauer | ................ | G06V 10/776 |
| 2019/0086912 A1* | 3/2019 | Hsu | ........................ | G06N 3/084 |
| 2019/0235484 A1* | 8/2019 | Ristovski | ................ | G06F 17/11 |
| 2019/0286983 A1* | 9/2019 | Jung | ........................ | G06N 3/04 |
| 2020/0130246 A1* | 4/2020 | Horiuchi | ............... | B29C 45/768 |
| 2022/0254006 A1* | 8/2022 | Jin | ........................ | G06V 20/44 |

FOREIGN PATENT DOCUMENTS

| | | |
|---|---|---|
| JP | 2011-100211 A | 5/2011 |
| JP | 2012-230703 A | 11/2012 |
| JP | 2016-517023 A | 6/2016 |
| JP | 2017-129896 A | 7/2017 |
| JP | 2019-009416 A | 1/2019 |
| JP | 2019-16209 A | 1/2019 |
| JP | 2019-40431 A | 3/2019 |
| JP | 2019-101495 A | 6/2019 |
| JP | 2019-106476 A | 6/2019 |
| JP | 2019-192009 A | 10/2019 |
| WO | 2012/073289 A1 | 6/2012 |
| WO | 2018/079840 A1 | 5/2018 |
| WO | 2019/003404 A1 | 1/2019 |
| WO | 2019/159483 A1 | 8/2019 |
| WO | 2019/208773 A1 | 10/2019 |

OTHER PUBLICATIONS

Ba et al, "Layer Normalization", Jul. 21, 2016. (Year: 2016).*
Ba et al., "Layer Normalization", Jul. 21, 2016.
Gong et al., "Memorizing Normality to Detect Anomaly: Memory-augmented Deep Autoencoder for Unsupervised Anomaly Detection", Aug. 6, 2019.
U.S. Appl. No. 17/105,765, filed Nov. 27, 2020, US20210166121A, Tokyo Electron Limited.

* cited by examiner

FIG.5

| TRAINING DATA | | | |
|---|---|---|---|
| APPARATUS | RECIPE TYPE | TIME SERIES DATA SET | ABNORMALITY LEVEL |
| EqA | PROCESS RECIPE I | TIME SERIES DATA SET 1 | LEVEL 2 |
| EqA | PROCESS RECIPE I | TIME SERIES DATA SET 2 | LEVEL 0 |
| EqA | PROCESS RECIPE II | TIME SERIES DATA SET 3 | LEVEL 0 |
| EqB | PROCESS RECIPE III | TIME SERIES DATA SET 4 | LEVEL 1 |
| EqB | PROCESS RECIPE III | TIME SERIES DATA SET 5 | LEVEL 0 |
| EqA | PROCESS RECIPE IV | TIME SERIES DATA SET 6 | LEVEL 2 |
| EqA | PROCESS RECIPE IV | TIME SERIES DATA SET 7 | LEVEL 3 |
| EqA | PROCESS RECIPE V | TIME SERIES DATA SET 8 | LEVEL 0 |
| EqC | PROCESS RECIPE VI | TIME SERIES DATA SET 9 | LEVEL 0 |
| EqC | PROCESS RECIPE II | TIME SERIES DATA SET 10 | LEVEL 1 |
| EqX | PROCESS RECIPE II | TIME SERIES DATA SET j-7 | LEVEL 3 |
| EqX | PROCESS RECIPE I | TIME SERIES DATA SET j-6 | LEVEL 0 |
| EqX | PROCESS RECIPE III | TIME SERIES DATA SET j-5 | LEVEL 0 |
| EqY | PROCESS RECIPE III | TIME SERIES DATA SET j-4 | LEVEL 2 |
| EqY | PROCESS RECIPE II | TIME SERIES DATA SET j-3 | LEVEL 1 |
| EqY | PROCESS RECIPE III | TIME SERIES DATA SET j-2 | LEVEL 0 |
| EqZ | PROCESS RECIPE III | TIME SERIES DATA SET j-1 | LEVEL 0 |
| EqZ | PROCESS RECIPE III | TIME SERIES DATA SET j | LEVEL 3 |

FIG.8
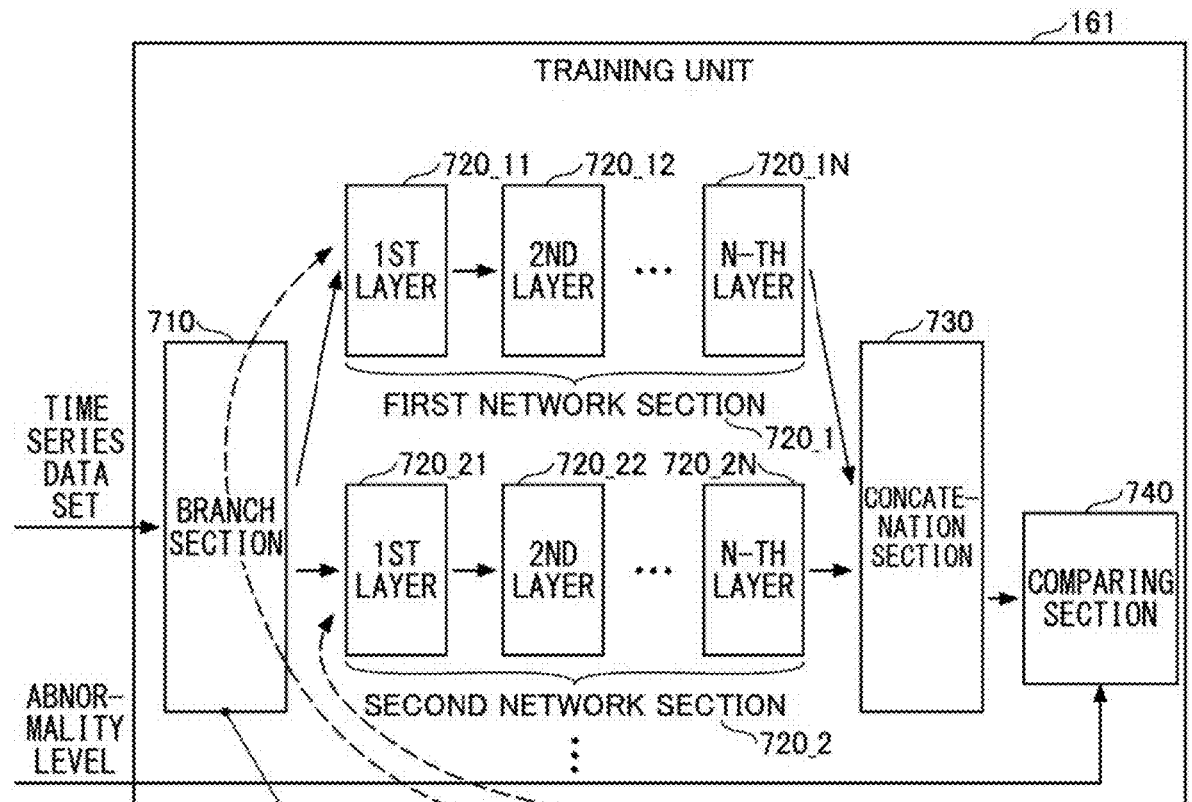
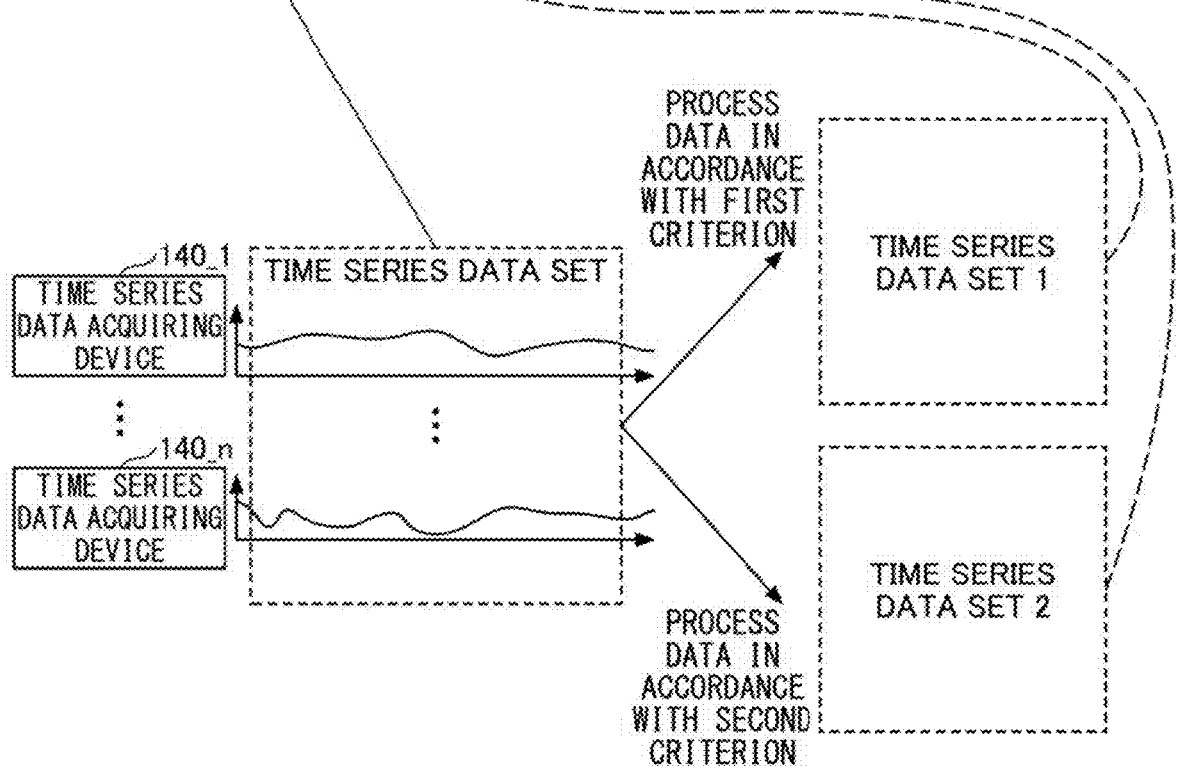

FIG.10
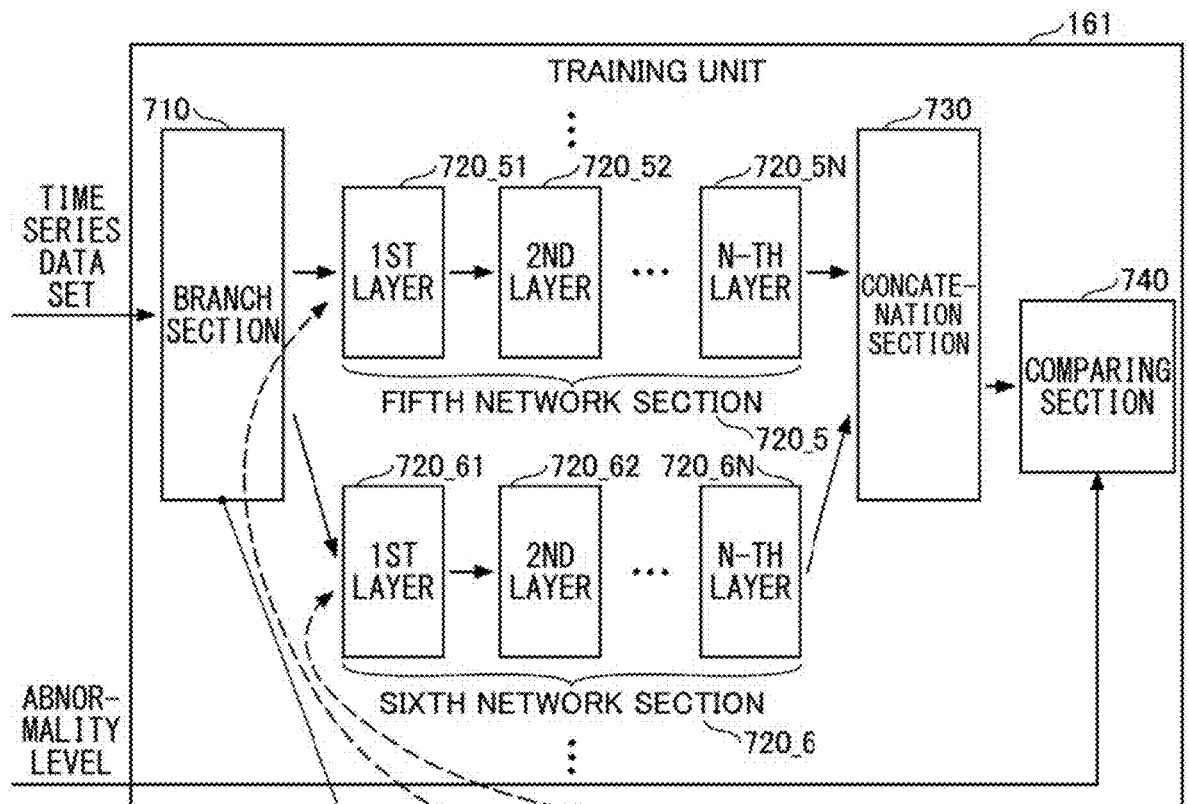
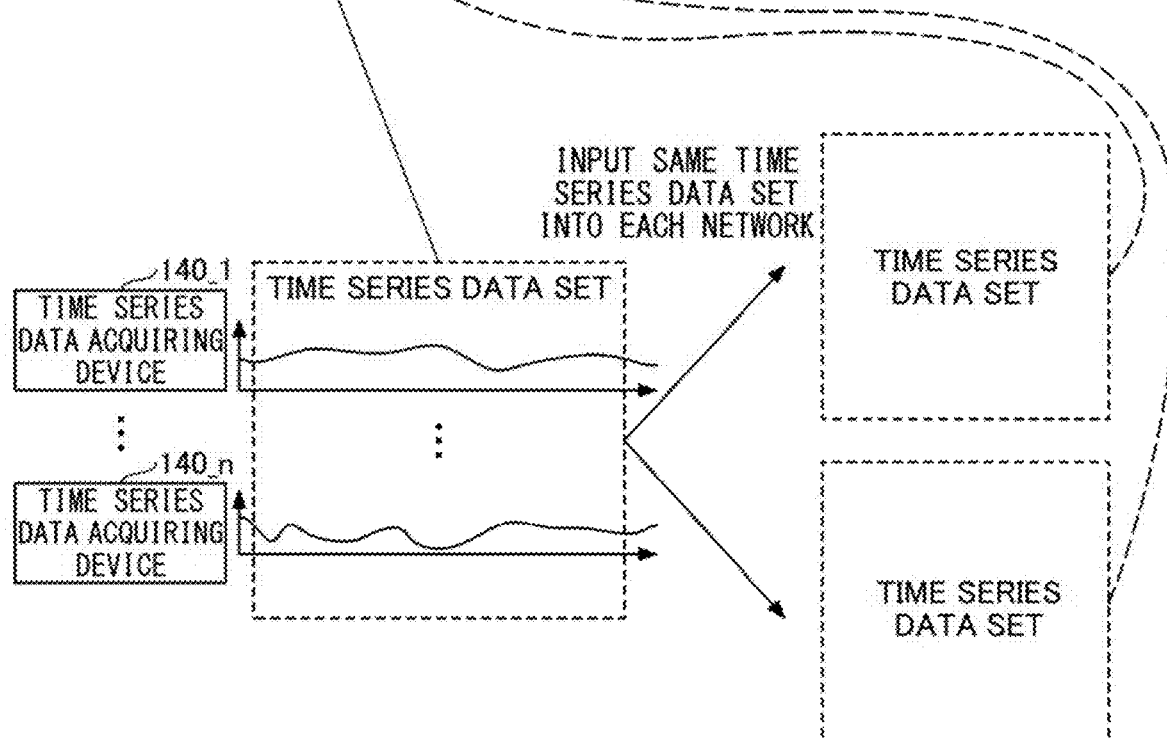

FIG.12
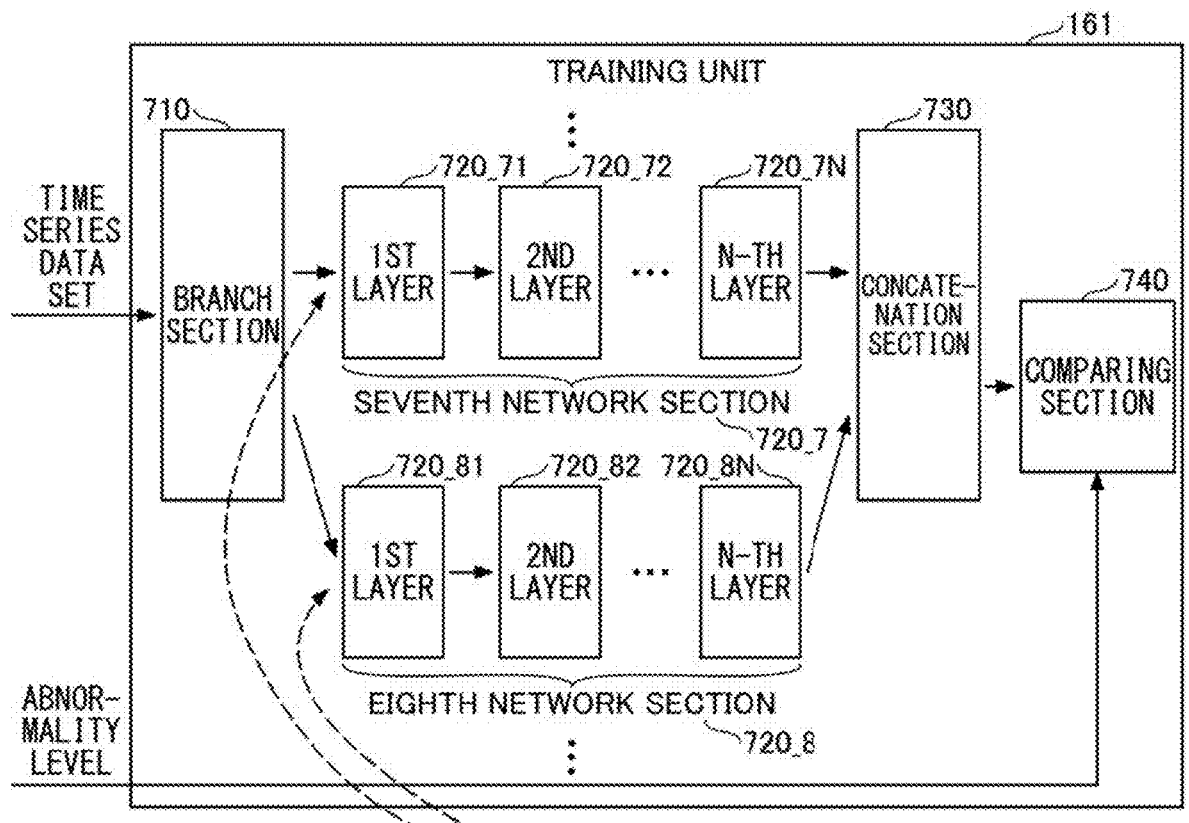
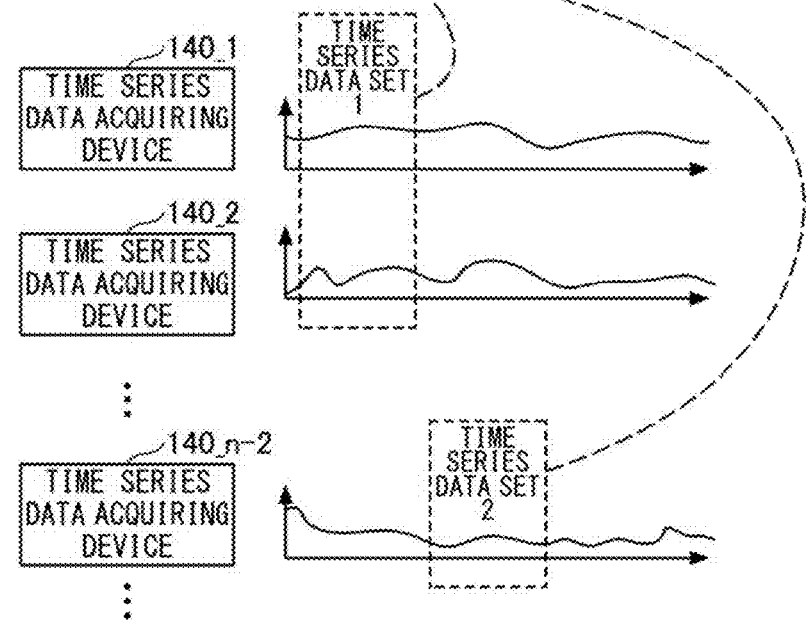

FIG.16

| APPARATUS | TRAINING DATA | | ABNORMALITY LEVEL |
|---|---|---|---|
| | RECIPE TYPE | OES DATA | |
| EqA | PROCESS RECIPE I | OES DATA 1 | LEVEL 2 |
| EqA | PROCESS RECIPE I | OES DATA 2 | LEVEL 0 |
| EqA | PROCESS RECIPE II | OES DATA 3 | LEVEL 0 |
| EqB | PROCESS RECIPE III | OES DATA 4 | LEVEL 1 |
| EqB | PROCESS RECIPE III | OES DATA 5 | LEVEL 0 |
| EqA | PROCESS RECIPE IV | OES DATA 6 | LEVEL 2 |
| EqA | PROCESS RECIPE IV | OES DATA 7 | LEVEL 3 |
| EqA | PROCESS RECIPE V | OES DATA 8 | LEVEL 0 |
| EqC | PROCESS RECIPE VI | OES DATA 9 | LEVEL 0 |
| EqC | PROCESS RECIPE II | OES DATA 10 | LEVEL 1 |
| EqX | PROCESS RECIPE II | OES DATA j-7 | LEVEL 3 |
| EqX | PROCESS RECIPE I | OES DATA j-6 | LEVEL 0 |
| EqX | PROCESS RECIPE III | OES DATA j-5 | LEVEL 0 |
| EqY | PROCESS RECIPE III | OES DATA j-4 | LEVEL 2 |
| EqY | PROCESS RECIPE II | OES DATA j-3 | LEVEL 1 |
| EqY | PROCESS RECIPE III | OES DATA j-2 | LEVEL 0 |
| EqZ | PROCESS RECIPE III | OES DATA j-1 | LEVEL 0 |
| EqZ | PROCESS RECIPE III | OES DATA j | LEVEL 3 |

1600

ABNORMALITY DETECTING DEVICE AND ABNORMALITY DETECTING METHOD

CROSS-REFERENCE TO RELATED APPLICATIONS

This patent application is based on and claims priority to Japanese Patent Application No. 2019-217438 filed on Nov. 29, 2019, the entire contents of which is incorporated herein by reference.

TECHNICAL FIELD

The present disclosure relates to an abnormality detecting device, an abnormality detecting method, and an abnormality detecting computer program product.

BACKGROUND

Conventionally, in the field of various manufacturing processes, an abnormality detection technique is known, which detects abnormalities that have occurred during various manufacturing processes from measurement data (sets of multiple types of time series data, hereinafter referred to as a "time series data set") measured during processing of an object.

For example, in a semiconductor manufacturing process, by using a pre-generated abnormality detection model, time series data sets measured during wafer processing are monitored, to determine occurrence of any abnormalities, degree of such abnormalities, and the like.

RELATED ART DOCUMENT

Patent Document

[Patent Document 1] Japanese Laid-open Patent Application Publication No. 2011-100211

SUMMARY

The present disclosure provides an abnormality detecting device, an abnormality detecting method, and an abnormality detecting computer program product capable of implementing a high-precision abnormality detecting process.

An abnormality detection device according to one aspect of the present disclosure includes a processor, and a non-transitory computer readable medium that has stored therein a computer program that, when executed by the processor, configures the processor to acquire one or more time series data sets measured along with processing of an object at a predetermined unit of process in a manufacturing process, and apply the one or more time series data sets in a neural network to develop a trained model. The neural network includes a plurality of network sections each configured to process the acquired time series data sets, and a concatenation section configured to combine output data output from each of the plurality of network sections as a result of processing the acquired time series data sets, and to output, as a combined result, a result of combining the output data output from each of the plurality of network sections. The computer program further configures the processor to compare the combined result with an abnormality level to train the trained model such that the combined result output from the concatenation section progressively approaches information indicating the abnormality level.

BRIEF DESCRIPTION OF THE DRAWINGS

FIG. 5 is a first diagram illustrating an example of training data;

FIG. 8 is a first diagram illustrating a specific example of processing performed in a branch section;

FIG. 10 is a third diagram illustrating a specific example of the processing performed in the branch section;

FIG. 12 is a fourth diagram illustrating a specific example of the processing performed in the branch section;

FIG. 16 is a second diagram illustrating an example of the training data;

DETAILED DESCRIPTION OF EMBODIMENTS

Figure 1:
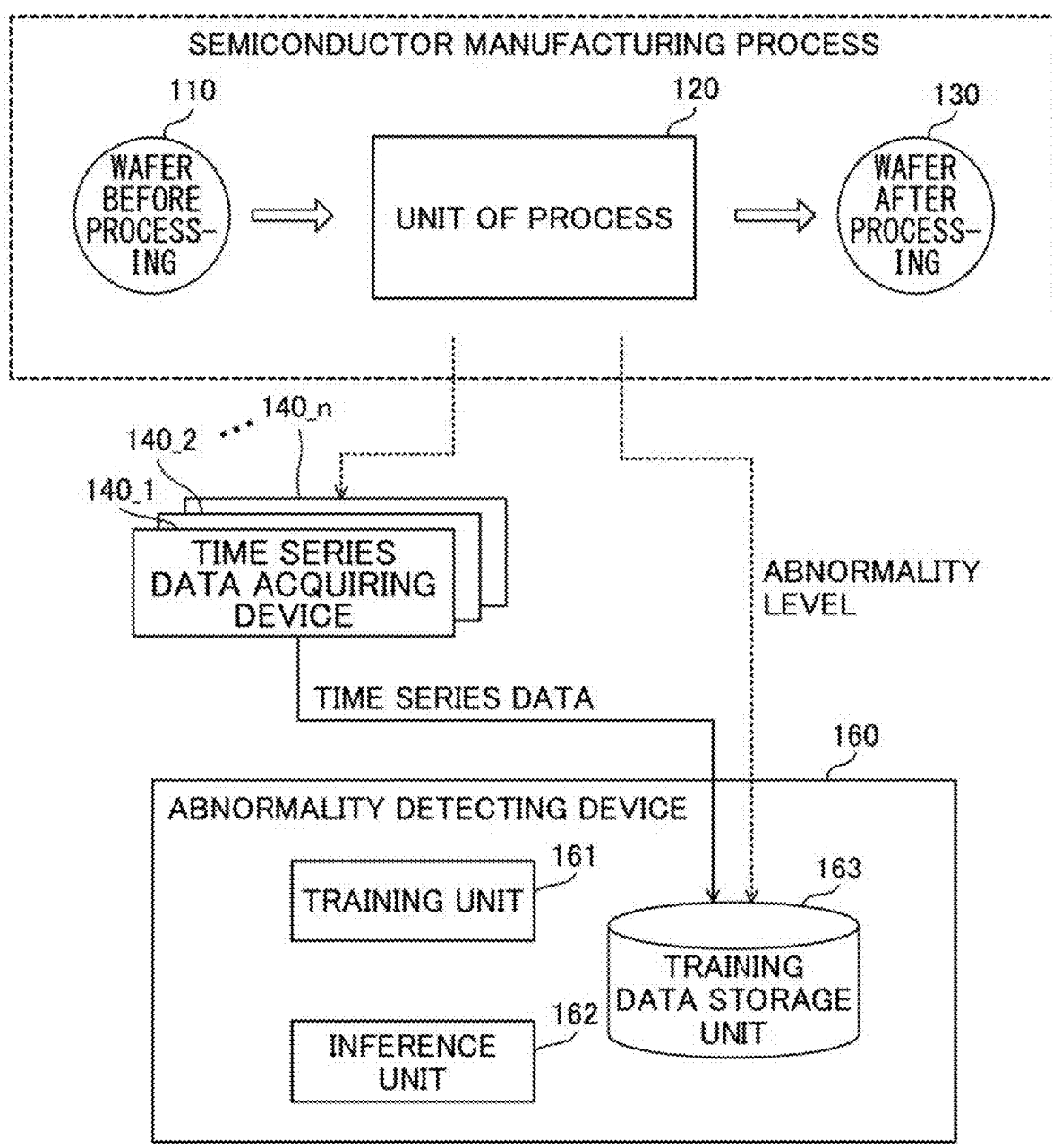
FIG. 1 is a first diagram illustrating an example of an overall configuration of a system including a device for performing a semiconductor manufacturing process and the abnormality detecting device.

Hereinafter, embodiments will be described with reference to the drawings. For substantially the same components in the present specification and drawings, overlapping descriptions are omitted by giving the same reference numerals.

First Embodiment

<Overall Configuration of the System Including the Semiconductor Manufacturing Process and the Abnormality Detecting Device>

First, the overall configuration of a manufacturing process (a semiconductor manufacturing process in the present embodiment) and a system including an abnormality detecting device will be described. FIG. 1 is a first diagram illustrating an example of an overall configuration of the system including a device for performing a semiconductor manufacturing process and the abnormality detecting device. As illustrated in FIG. 1, the system 100 includes a device for performing a semiconductor manufacturing process, time series data acquiring devices 140_1 to 140_n, and the abnormality detecting device 160.

In the semiconductor manufacturing process, an object (e.g., wafer before processing 110) is processed at a predetermined unit of process 120 to produce a result (e.g., wafer after processing 130). The unit of process 120 described herein is a specialized term related to a particular semiconductor manufacturing process performing in a processing chamber, and details will be described below. Also, a wafer before processing 110 refers to a wafer (substrate) before being processed at the chamber(s) that perform unit of process 120, and wafer after processing 130 refers to a wafer (substrate) after being processed in the chamber (s) that that perform the unit of process 120.

The time series data acquiring devices 140_1 to 140_n each acquire time series data measured along with processing of the wafer before processing 110 at the unit of process 120. The time series data acquiring devices 140_1 to 140_n each measure different properties. It should be noted that the number of measurement items that each of the time series data acquiring devices 140_1 to 140_n measures may be one, or more than one. The time series data measured in accordance with the processing of the wafer before processing 110 includes not only time series data measured during the processing of the wafer before processing 110 but also time series data measured during pre-processing or post-processing of the wafer before processing 110. These processes may include pre-processing and post-processing performed without a wafer (substrate).

The time series data sets acquired by the time series data acquiring devices 140_1 to 140_n are stored in a training data storage unit 163 (a non-transitory memory device) in the abnormality detecting device 160, as training data (input data in the training data).

Information indicating a degree of abnormality (may also be referred to as an "abnormality level"), which is acquired during processing of the wafer before processing 110 at the unit of process 120, is stored in the training data storage unit 163 in the abnormality detecting device 160, as training data (correct answer data in the training data, or ground truth data) in association with the time series data sets.

An abnormality detecting program (code that is executed on a processor to implement the algorithms discussed herein) is installed in the abnormality detecting device 160. By executing the error detecting program, the abnormality detecting device 160 functions as a training unit 161 and an inference unit 162.

The training unit 161 performs machine learning using the training data (time series data sets acquired by the time series data acquiring devices 140_1 to 140_n and information indicating the abnormality level associated with the time series data sets). Specifically, the training unit 161 processes the time series data sets, which are input data, using multiple network sections, and performs machine learning with respect to the network sections such that a combined result of output data obtained from each of the network sections approaches the information indicating the abnormality level, which is the correct answer data.

The inference unit 162 inputs time series data sets acquired by the time series data acquiring devices 140_1 to 140_n in accordance with processing of a new object (e.g., wafer before processing) in the unit of process 120, to multiple network sections to which machine learning has been applied. Accordingly, the inference unit 162 infers (outputs) information indicating a degree of abnormality based on the time series data sets acquired in accordance with the processing of the new wafer.

As described above, by processing time series data sets acquired along with processing of an object at the predetermined unit of process 120 in the semiconductor manufacturing process, by using multiple network sections, it is possible to analyze the time series data sets acquired in the predetermined unit of process in a multifaceted manner. As a result, according to the abnormality detecting device 160, a model (inference unit 162) for realizing an abnormality detecting process with high-precision can be generated, as compared to a configuration in which a single network section is used. Once trained by the training unit 161, the interference unit embodies a learned model that is able to accurately identify an anomaly level for an object yet to be processed, and thus can be used to control/adjust semiconductor manufacturing equipment to accommodate the anomaly level for the object yet to be processed and reliably produce an object despite the anomaly level associated with the object to be processed, and the process steps used to make the produced object. While the term "unit" is used herein for devices such as the training unit and the inference unit, it should be understood that the term "circuitry" may be used as well (e.g., "training circuitry" or "inference circuitry"). This is because the circuit device(s) that execute the operations implemented as software code and/or logic operations are configured by the software code and/or logic operations to execute the algorithms described herein.

<Predetermined "Unit of Process" in Semiconductor Manufacturing Process>

Figure 2A:
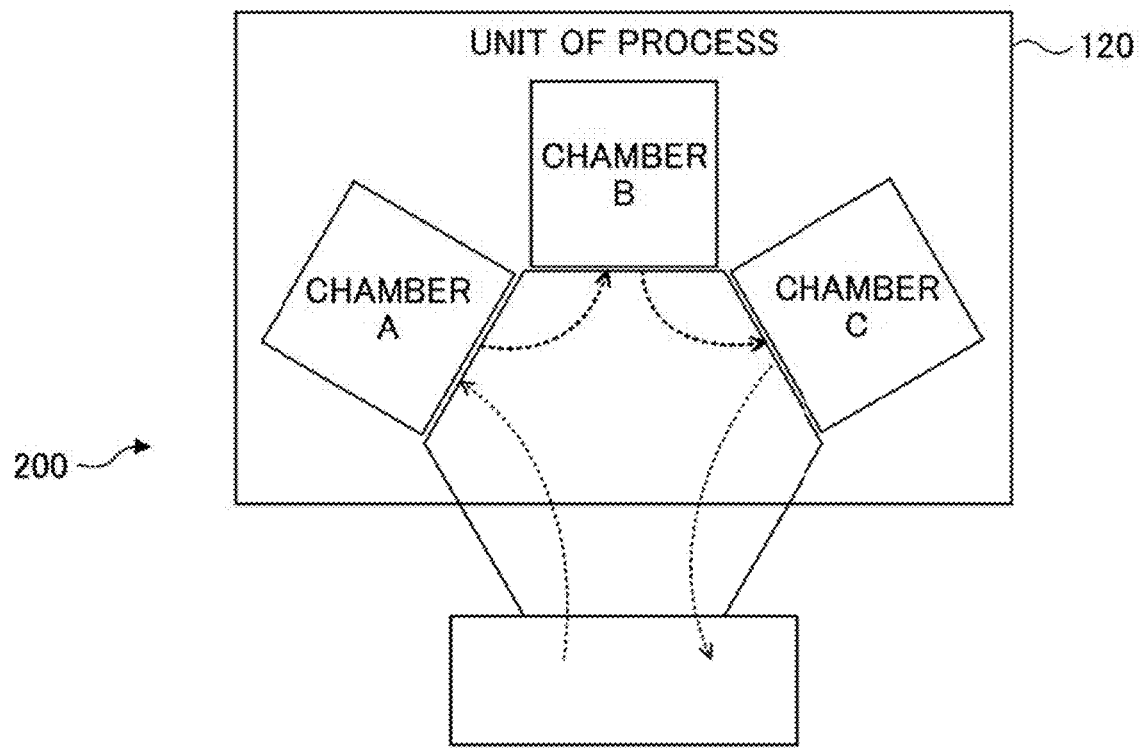
FIGS. 2A and 2B are diagrams each illustrating an example of a predetermined unit of process in the semiconductor manufacturing process.
Figure 2B:
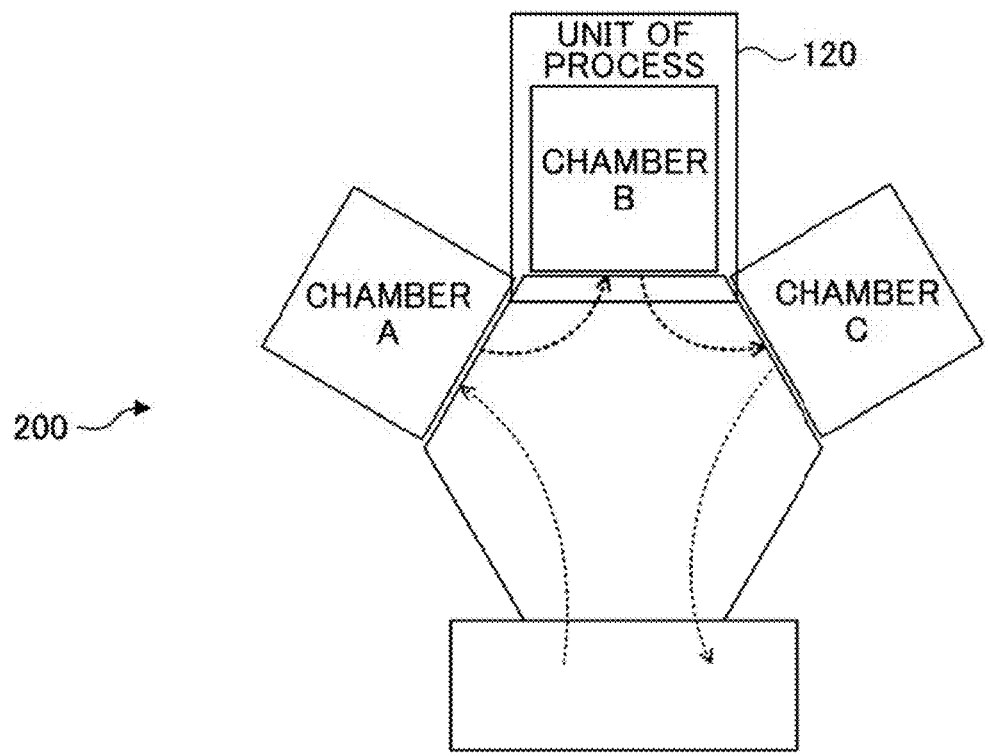

Next, the predetermined unit of process 120 in the semiconductor manufacturing process will be described. FIGS. 2A and 2B are diagrams each illustrating an example of a predetermined unit of process in the semiconductor manufacturing process. As illustrated in FIG. 2A or 2B, a semiconductor manufacturing device 200, which is an example of a substrate processing apparatus, includes multiple chambers. Each of the chambers is an example of a processing space. In the example of FIG. 2, the semiconductor manufacturing device 200 includes chambers A to C, and wafers are processed in each of the chambers A to C.

FIG. 2A illustrates a case in which processes performed in the multiple chambers are respectively defined as a unit of process 120. Wafers are processed in the chamber A, the chamber B, and the chamber C, in sequence. In this case, a wafer before processing 110 (FIG. 1) refers to a wafer before being processed in the chamber A, and a wafer after processing 130 refers to a wafer after being processed in the chamber C.

Time series data sets measured in accordance with processing of the wafer before processing 110 in the unit of process 120 of FIG. 2A include:

a time series data set output in accordance with a wafer process performed in the chamber A (first processing space), a time series data set output in accordance with a wafer process performed in the chamber B (second processing space), and a time series data set output in accordance with a wafer process performed in the chamber C (third processing space).

Meanwhile, FIG. 2B illustrates a case in which a process performed in a single chamber (in the example of FIG. 2B, the "chamber B") is defined as a unit of process 120. In this case, a wafer before processing 110 refers to a wafer that has been processed in the chamber A and that is to be processed in the chamber B, and a wafer after processing 130 refers to a wafer that has been processed in the chamber B and is to be processed in the chamber C.

Further, in reference to FIG. 2B, time series data sets measured along with processing of the wafer before processing 110 (FIG. 1) include time series data set measured in accordance with processing of the wafer before processing 110 (FIG. 1) performed in the chamber B.

Figure 3:
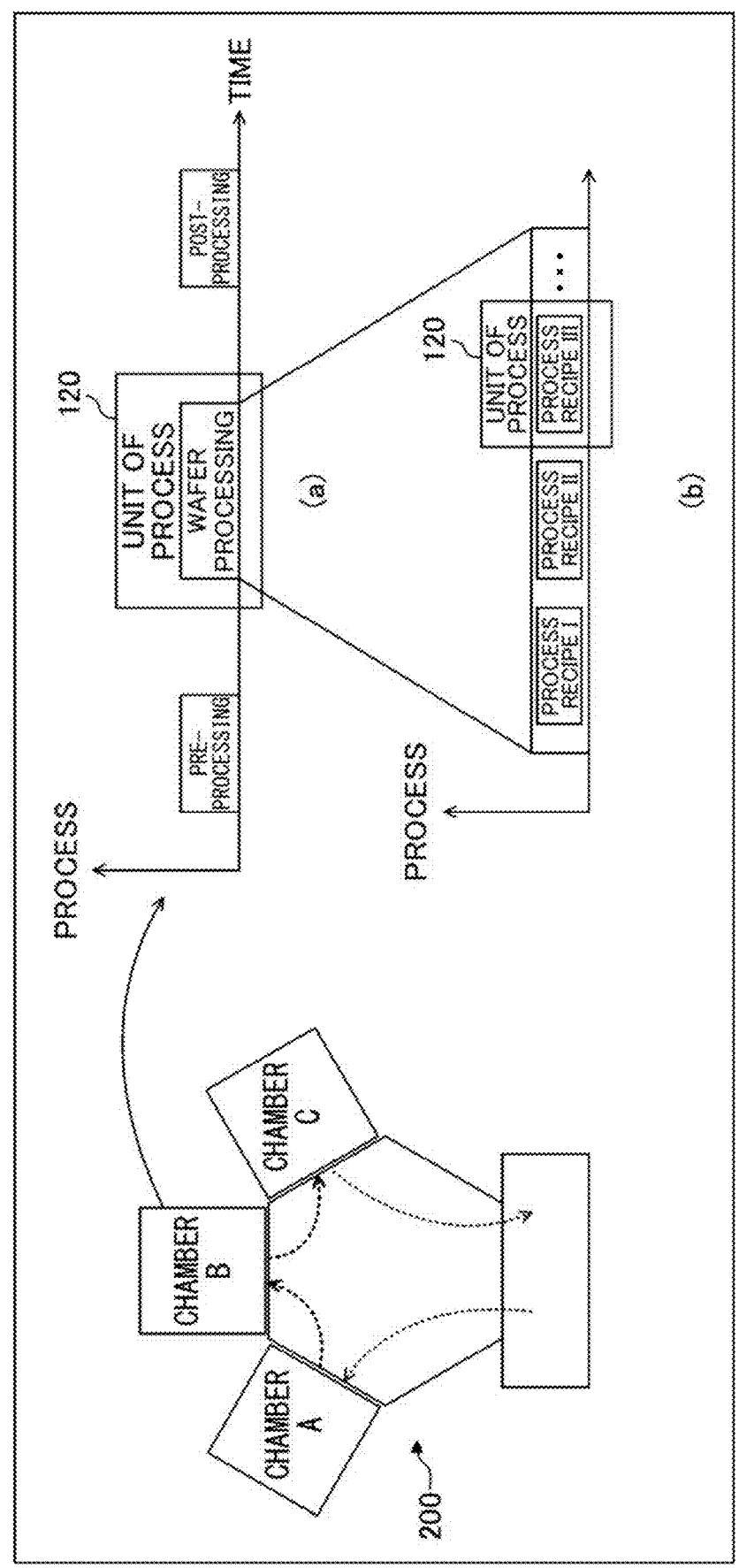
FIG. 3 is another diagram illustrating examples of the predetermined unit of process in the semiconductor manufacturing process.

FIG. 3 is another diagram illustrating examples of the predetermined unit of process in the semiconductor manufacturing process. Similar to FIG. 2A or 2B, the semiconductor manufacturing device 200 includes multiple chambers, in each of which a different type of treatment is applied to wafers. However, in another embodiment, the same type of treatment may be applied to wafers in at least two chambers in the multiple chambers.

A time-diagram (a) of FIG. 3 illustrates a case in which a process (called "wafer processing") excluding preprocessing and post-processing among processes performed in the chamber B is defined as a unit of process 120. In this case, a wafer before processing 110 (FIG. 1) refers to a wafer before the wafer processing is performed (after the pre-processing is performed), and a wafer after processing 130 (FIG. 1) refers to a wafer after the wafer processing is performed (before the post-processing is performed).

In the unit of process 120 of the time-diagram (a) in FIG. 3, time series data sets measured along with processing of the wafer before processing 110 include time series data sets measured along with the wafer processing of the wafer before processing 110 performed in the chamber B.

The time-diagram (a) in FIG. 3 illustrates a case in which preprocessing, wafer processing (this process), and post-processing are performed in the same chamber (chamber B) and in which the wafer processing is defined as the unit of process 120. However, in a case in which each of the processing is performed in a different chamber, (e.g., a case in which the preprocessing, the wafer processing, and the post-processing are performed in the chambers A, B, and C, respectively) processing performed in the chamber B may be defined as a unit of process 120. Alternatively, in another embodiment, processing performed in the chamber A or C may be defined as a unit of process 120. Thus, it should be understood that a unit of process may be a process performed solely in one chamber, or a process performed sequentially in more than one chambers.

In contrast, a time-diagram (b) of FIG. 3 illustrates a case in which processing according to one process recipe ("process recipe III" in the example of the time-diagram (b)) included in wafer processing, among processes performed in the chamber B, is defined as a unit of process 120. In this case, a wafer before processing 110 refers to a wafer before a process according to the process recipe III is applied (and after a process according to the process recipe II has been applied). A wafer after processing 130 refers to a wafer after a process according to the process recipe III has been applied (and before a process according to the process recipe IV (not illustrated) is applied).

Further, in the unit of process 120 of the time-diagram (b) in FIG. 3, time series data sets measured along with processing of the wafer before processing 110 include time series data sets measured during the processing according to the process recipe III performed in the chamber B.

<Hardware Configuration of Abnormality Detecting Device>

Figure 4:
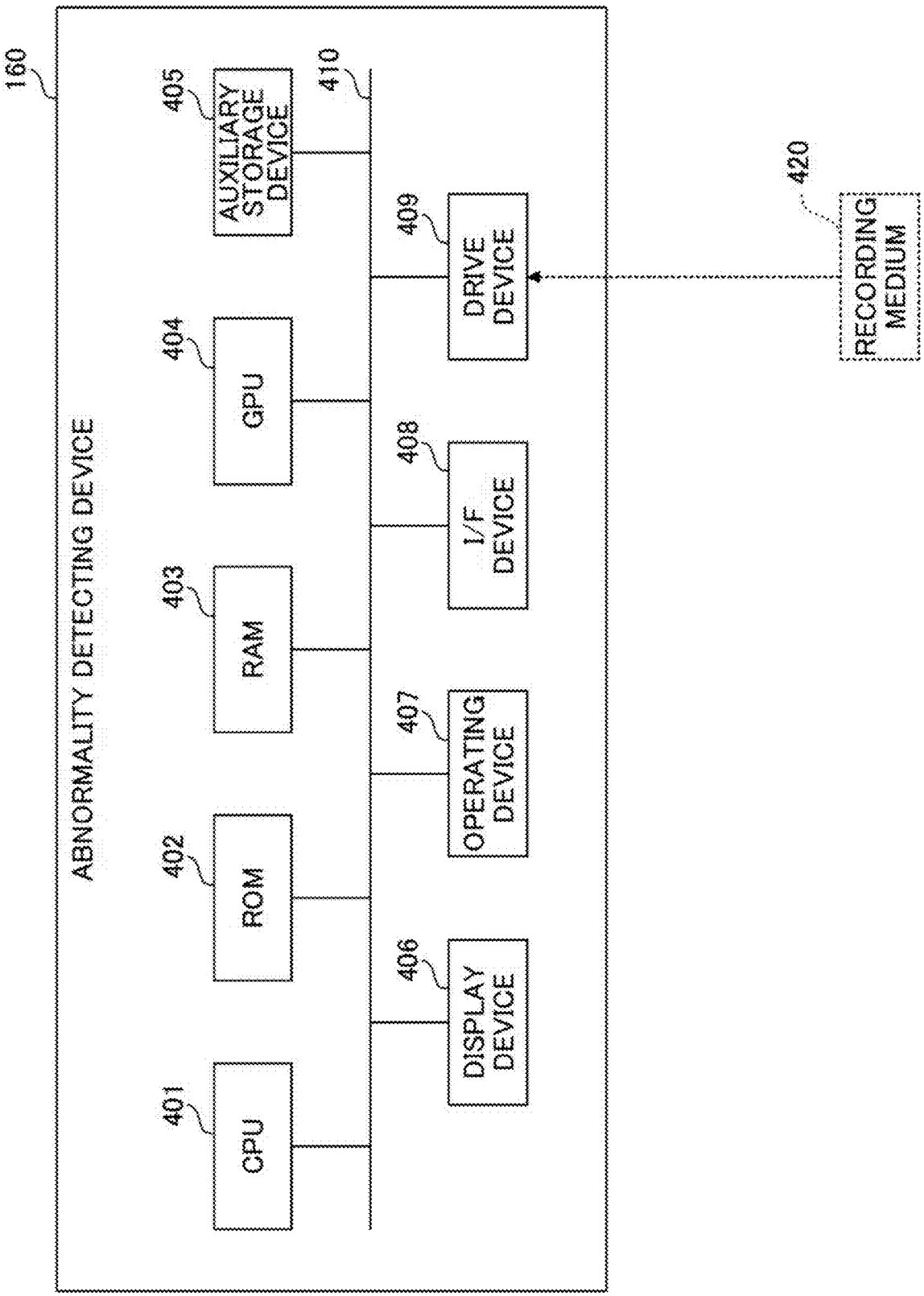
FIG. 4 is a diagram illustrating an example of the hardware configuration of the abnormality detecting device.

Next, the hardware configuration of the abnormality detecting device 160 will be described. FIG. 4 is a diagram illustrating an example of the hardware configuration of the abnormality detecting device 160. As illustrated in FIG. 4, the abnormality detecting device 160 includes a CPU (Central Processing Unit) 401, a ROM (Read Only Memory) 402, and a RAM (Random Access Memory) 403. The abnormality detecting device 160 also includes a GPU (Graphics Processing Unit) 404. Processors (processing circuitry) such as the CPU 401 and the GPU 404, and memories such as the ROM 402 and the RAM 403 constitute a so-called computer, wherein the processors (circuitry) may be configured by software to execute the algorithms described herein.

The abnormality detecting device 160 further includes an auxiliary storage device 405, a display device 406, an operating device 407, an interface (I/F) device 408, and a drive device 409. Each hardware element in the abnormality detecting device 160 is connected to each other via a bus 410.

The CPU 401 is an arithmetic operation processing device that executes various programs (e.g., abnormality detecting program) installed in the auxiliary storage device 405.

The ROM 402 is a non-volatile memory that functions as a main memory unit. The ROM 402 stores programs and data required for the CPU 401 executing the various programs installed in the auxiliary storage device 405. Specifically, the ROM 402 stores a boot program such as BIOS (Basic Input/Output System) or EFI (Extensible Firmware Interface).

The RAM 403 is a volatile memory, such as a DRAM (Dynamic Random Access Memory) or an SRAM (Static Random Access Memory), and functions as a main memory unit. The RAM 403 provides a work area on which the various programs installed in the auxiliary storage device 405 are loaded when the various programs are executed by the CPU 401.

The GPU 404 is an arithmetic operation processing device for image processing. When the CPU 401 executes the abnormality detecting program, the GPU 404 performs high-speed calculation of various image data (i.e., the time series data sets in the present embodiment) by using parallel processing. The GPU 404 includes an internal memory (GPU memory) to temporarily retain information needed to perform parallel processing of the various image data.

The auxiliary storage device 405 stores the various programs and various data used when the various programs are executed by the CPU 401. For example, the training data storage unit 163 is implemented by the auxiliary storage device 405.

The display device 406 displays an internal state of the abnormality detecting device 160. The operating device 407 is an input device used by an administrator of the abnormality detecting device 160 when the administrator inputs various instructions to the abnormality detecting device 160. The I/F device 408 is a connecting device for connecting and communicating with a network (not illustrated).

The drive device 409 is a device into which a recording medium 420 is loaded. Examples of the recording medium 420 include a medium for optically, electrically, or magnetically recording information, such as a CD-ROM, a flexible disk, and a magneto-optical disk. In addition, examples of the recording medium 420 may include a semiconductor memory or the like that electrically records information, such as a ROM, and a flash memory.

The various programs (computer executable code) installed in the auxiliary storage device 405 are installed when, for example, a recording medium 420 distributed is loaded into the drive device 409 and the various programs recorded in the recording medium 420 are read out by the drive device 409. Alternatively, the various programs installed in the auxiliary storage device 405 may be installed by being downloaded via a network (not illustrated).

<Example of Training Data>

Next, training data that is read out from the training data storage unit 163 when the training unit 161 performs machine learning will be described. FIG. 5 is a first diagram illustrating an example of the training data. As illustrated in FIG. 5, the training data 500 includes "APPARATUS", "RECIPE TYPE", "TIME SERIES DATA SET", and "ABNORMALITY LEVEL" as items of information. Here, a case in which the predetermined unit of process 120 is a process according to one process recipe will be described.

The "APPARATUS" field stores an identifier indicating a semiconductor manufacturing device (e.g., semiconductor manufacturing device 200) to be monitored as to whether abnormality occurs. The "RECIPE TYPE" field stores an identifier (e.g., process recipe I) indicating a process recipe, which is performed when a corresponding time series data set is measured, among process recipes performed in the corresponding semiconductor manufacturing device (e.g., EqA).

The "TIME SERIES DATA SET" field stores time series data sets measured by the time series data acquiring devices 140_1 to 140_n when processing according to the process recipe indicated by the "RECIPE TYPE" is performed in the semiconductor manufacturing device indicated by the "APPARATUS".

The "ABNORMALITY LEVEL" field stores information indicating a degree of abnormality (numerical representation of the degree of abnormality), which is acquired when the corresponding time series data sets (for example, time series data set 1) are measured by the time series data acquiring devices 140_1 to 140_n. Incidentally, in the example of FIG. 5, as the information indicating the degree of abnormality, one of "LEVEL 0", "LEVEL 1", "LEVEL 2", "LEVEL 3" is stored.

<Example of Time Series Data Set>

Figure 6A:
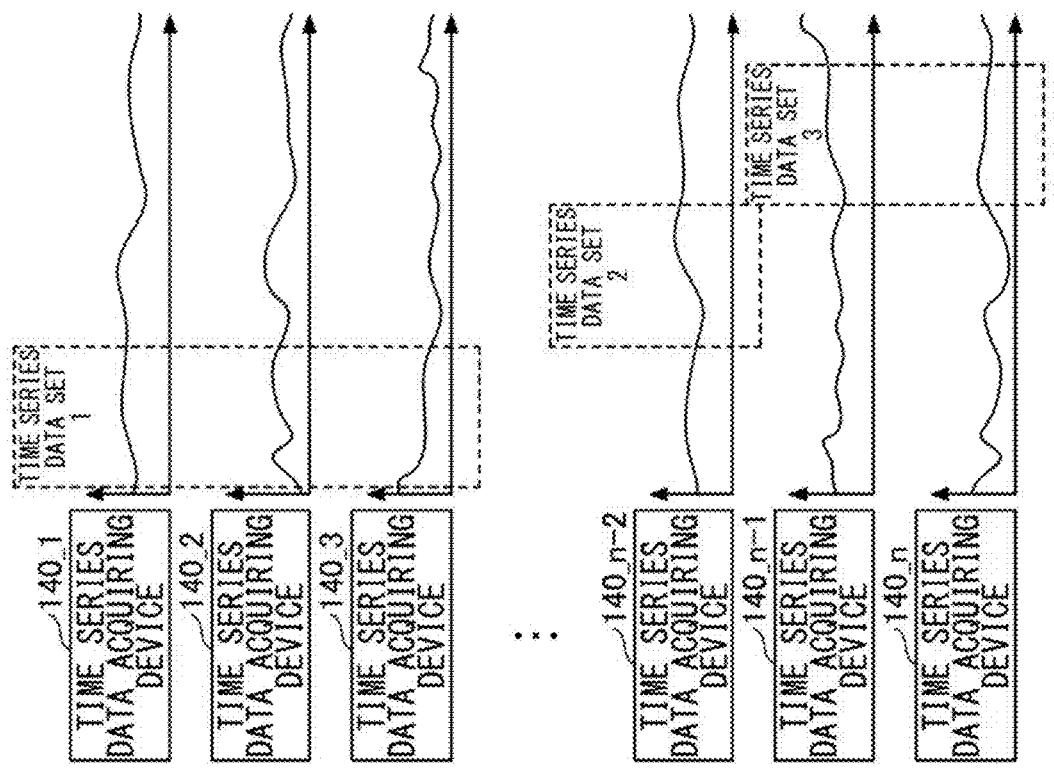
FIGS. 6A and 6B are diagrams illustrating examples of time series data sets.
Figure 6B:
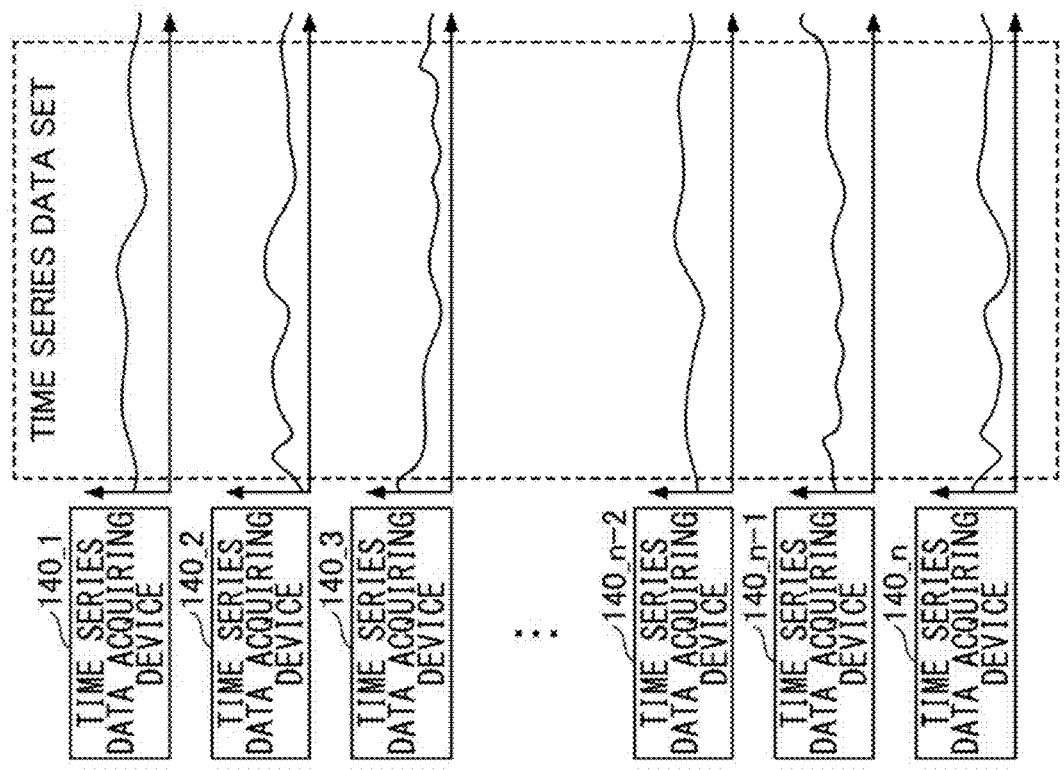

Next, specific examples of the time series data sets measured by the time series data acquiring devices 140_1 to 140_n will be described. FIGS. 6A and 6B are diagrams illustrating examples of the time series data sets. In the example of FIGS. 6A and 6B, to simplify the explanation, each of the time series data acquiring devices 140_1 to 140_n measures one-dimensional data. However, at least one of the time series data acquiring devices 140_1 to 140_n may measure two-dimensional data (set of multiple types of one-dimensional data).

FIG. 6A represents time series data sets in which the unit of process 120 is as illustrated in any of FIG. 2B, the diagram (a) of FIG. 3, and the diagram (b) of FIG. 3. In this case, each of the time series data acquiring devices 140_1 to 140_n acquires time series data measured during processing of a wafer before processing 110 in the chamber B. Each of the time series data acquiring devices 140_1 to 140_n acquires time series data measured within the same time frame as the time series data set.

In contrast, FIG. 6B represents time series data sets when the unit of process 120 is as illustrated in FIG. 2A. In this case, the time series data acquiring devices 140_1 to 140_3 acquire, for example, the time series data set 1 measured along with processing of a wafer before processing in the chamber A. The time series data acquiring device 140_n–2, acquires, for example, the time series data set 2 measured along with processing of the wafer in the chamber B. The time series data acquiring devices 140_n–1 and 140_n acquire the time series data set 3, which is measured along with processing of the wafer in the chamber C, for example.

FIG. 6A illustrates a case in which each of the time series data acquiring devices 140_1 to 140_n acquires, as the time series data set, time series data measured along with the processing of the wafer before processing in the chamber B during the same time frame. However, each of the time series data acquiring devices 140_1 to 140_n may acquire, as the time series data sets, multiple sets of time series data each measured during a different range of time along with processes of a wafer before processing performed in the chamber B.

Specifically, the time series data acquiring devices 140_1 to 140_n may acquire time series data measured during preprocessing, as the time series data set 1. The time series data acquiring devices 140_1 to 140_n may acquire time series data measured during wafer processing, as the time series data set 2. Further, the time series data acquiring devices 140_1 to 140_n may acquire time series data measured during post-processing, as the time series data set 3.

Alternatively, the time series data acquiring devices 140_1 to 140_n may acquire time series data measured during processing in accordance with the process recipe I, as the time series data set 1. The time series data acquiring devices 140_1 to 140_n may acquire time series data measured during processing in accordance with the process recipe II, as the time series data set 2. Further, the time series data acquiring devices 140_1 to 140_n may acquire time series data measured during processing in accordance with the process recipe III, as the time series data set 3.

<Functional Configuration of Training Unit>

Figure 7:
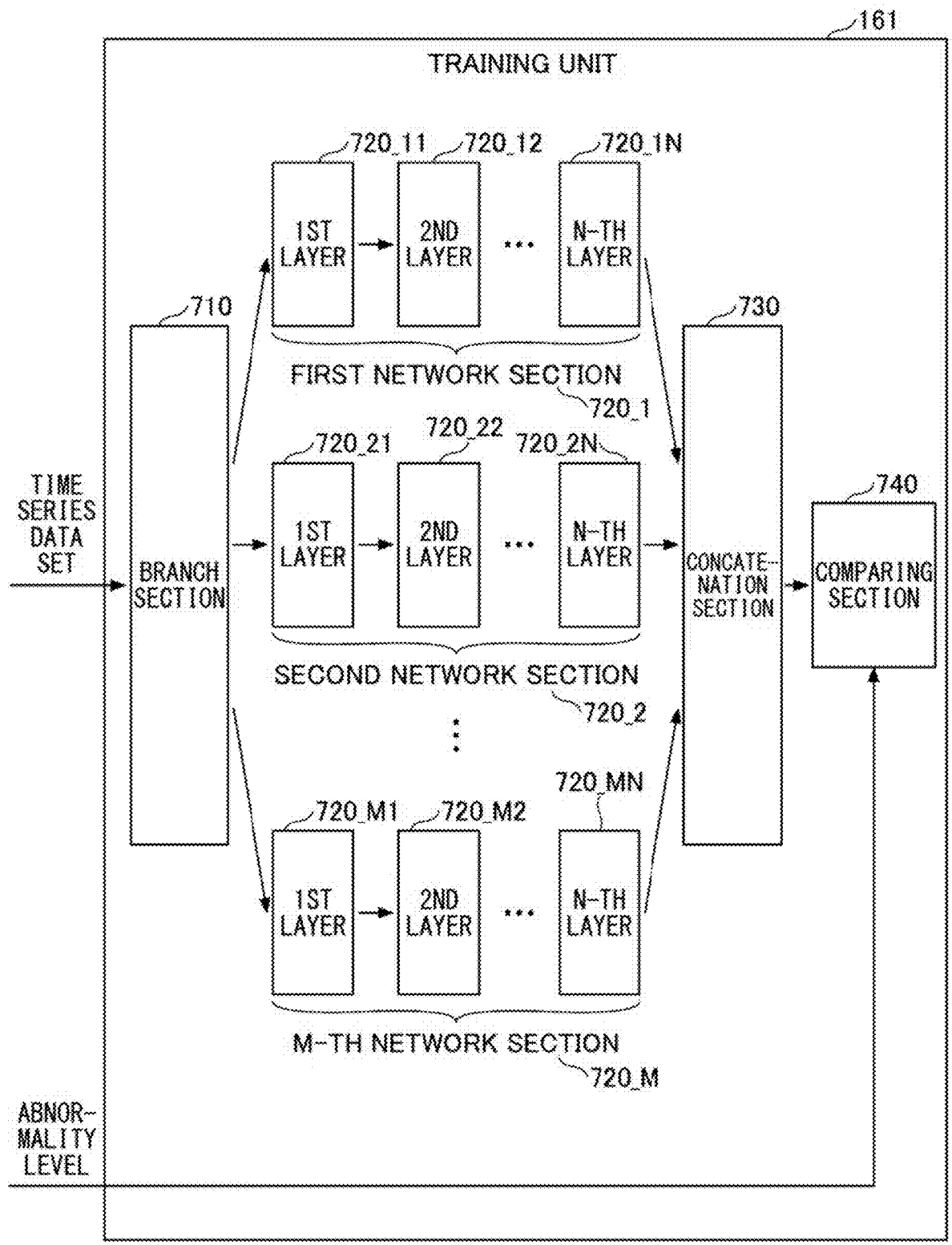
FIG. 7 is a first diagram illustrating an example of the functional configuration of a training unit.

Next, the functional configuration of the training unit 161 will be described. FIG. 7 is a first diagram illustrating an example of the functional configuration of the training unit 161. The training unit 161 includes a branch section 710, multiple network sections including a first network section 720_1, a second network section 720_2, . . . , and an M-th network section 720_M, a concatenation section 730, and a comparing section 740.

The branch section 710 is an example of an acquisition unit, and reads out the time series data sets from the training data storage unit 163. The branch section 710 processes the time series data sets so that the time series data sets that are read out from the training data storage unit 163 are processed by the network sections of the first network section 720_1 to the M-th network section 720_M.

The first to M-th network sections (720_1 to 720_M) are configured based on a convolutional neural network (CNN), which include multiple layers.

Specifically, the first network section 720_1 has a first layer 720_11, a second layer 720_12, . . . , and an N-th layer 720_1N. Similarly, the second network section 720_2 has a first layer 720_21, a second layer 720_22, . . . , and an N-th layer 720_2N. Other network sections are also configured similarly. For example, the M-th network section 720_M has a first layer 720_M1, a second layer 720_M2, ..., and an N-th layer 720_MN.

Each of the first to N-th layers (720_11 to 720_1N) in the first network section 720_1 performs various types of processing such as normalization processing, convolution processing, activation processing, and pooling processing. Similar types of processing are performed at each of the layers in the second to M-th network sections (720_2 to 720_M).

The concatenation section 730 combines each output data output from the N-th layers (720_1N to 720_MN) of the first to M-th network sections (720_1 to 720_M), and outputs a combined result to the comparing section 740. Similar to the network sections (720_1 to 720_M), the concatenation section 730 may be configured to be trained by machine learning. The concatenation section 730 may be implemented as a convolutional neural network or other type of neural network.

The comparing section 740 compares the combined result output from the concatenation section 730, with the information indicating the degree of abnormality (correct answer data) read out from the training data storage unit 163, to calculate error. The training unit 161 performs machine learning with respect to the first to M-th network sections (720_1 to 720_M) and the concatenation section 730 by error backpropagation, such that error calculated by the comparing section 740 satisfies the predetermined condition.

By performing machine learning, model parameters of each of the first to M-th network sections 720_1 to 720_M and the model parameters of the concatenation section 730 are optimized to determine abnormality level for the semiconductor manufacturing processes used to produce a processed substrate.

<Details of Processing in Each Part of the Training Unit>

Next, details of the processing performed in each part (in particular, the branch section) of the training unit 161 will be described with reference to specific examples.

(1) Details of Processing (1) Performed in the Branch Section

First, the processing of the branch section 710 will be described in detail. FIG. 8 is a first diagram illustrating a specific example of the processing performed in the branch section 710. In the case illustrated in FIG. 8, the branch section 710 generates time series data set 1 (first time series data set) by processing the time series data sets measured by the time series data acquiring devices 140_1 to 140_n in accordance with a first criterion, and inputs the time series data set 1 into the first network section 720_1.

The branch section 710 also generates time series data set 2 (second time series data set) by processing the time series data sets measured by the time series data acquiring devices 140_1 to 140_n in accordance with a second criterion, and inputs the time series data set 2 into the second network section 720_2.

As described above, because the training unit 161 is configured such that multiple sets of data (e.g., time series data set 1 and time series data set 2 in the above-described example) are generated by processing the time series data sets in accordance with each of the different criteria (e.g., first criterion and second criterion) and that each of the multiple sets of data is processed in a different network section, and because machine learning is performed on the above-described configuration, the unit of process 120 can be analyzed in a multifaceted manner. As a result, a model (inference unit 162) that realizes a high inference accuracy can be generated as compared to a case in which time series data sets are processed using a single network section.

The example of FIG. 8 illustrates a case in which two sets of data are generated by processing the time series data sets in accordance with each of the two types of criteria. However, more than two sets of data may be generated by processing the time series data sets in accordance with each of three or more types of criteria. Further, various types of criteria may be used for processing time series data sets. For example, if the time series data sets includes data obtained by optical emission spectroscopy, an average of intensity of light may be used as a criterion. In addition, a characteristic value of a wafer such as a film thickness of a wafer, or a characteristic value of wafers in a production lot, may be used as a criterion. Further, a value indicating a state of a chamber, such as a usage time of the chamber or the number of times of preventive maintenance, may also be used as a criterion.

(2) Details of Processing (2) Performed in the Branch Section

Figure 9:
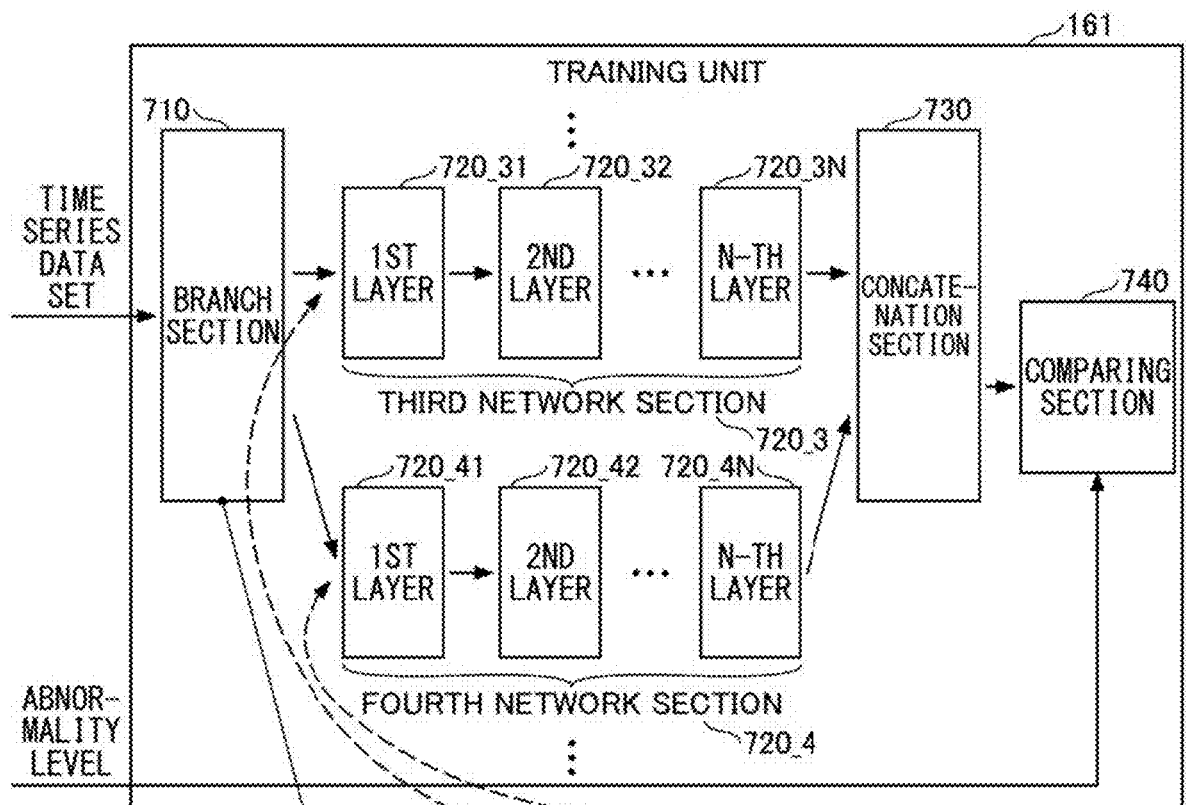
FIG. 9 is a second diagram illustrating a specific example of the processing performed in the branch section.

Next, another processing performed in the branch section 710 will be described in detail. FIG. 9 is a second diagram illustrating a specific example of the processing performed in the branch section 710. In the case of FIG. 9, the branch section 710 generates the time series data set 1 (first time series data set) and the time series data set 2 (second time series data set) by classifying the time series data sets measured by the time series data acquiring devices 140_1 to 140_n in accordance with data types. The branch section 710 inputs the generated time series data set 1 into the third network section 720_3 and inputs the generated time series data set 2 into the fourth network section 720_4.

As described above, because the training unit 161 is configured to classify the time series data sets into multiple sets of data (e.g., time series data set 1 and time series data set 2 in the above-described example) in accordance with data type, and to process each of the multiple sets of data in a different network section, and because machine learning is performed on the above-described configuration, the unit of process 120 can be analyzed in a multifaceted manner. As a result, it is possible to generate a model (inference unit 162) that achieves a high inference accuracy, as compared to a case in which machine learning is performed by inputting time series data sets into a single network section.

In the example of FIG. 9, the time series data sets are grouped (classified) in accordance with differences in data type due to differences in the time series data acquiring devices 140_1 to 140_n. For example, the time series data sets may be grouped into a data set acquired by optical emission spectroscopy and a data set acquired by mass spectrometry. However, time series data sets may be grouped in accordance with a time range for which data is acquired. For example, in a case in which the time series data sets consist of time series data measured along with processes according to multiple process recipes (e.g., process recipes I to III), the time series data sets may be grouped into three groups (e.g., time series data sets 1 to 3) according to the time ranges of the respective process recipes. Alternatively, the time series data sets may be grouped in accordance with environmental data (e.g., ambient pressure, air temperature). Further, the time series data sets may be grouped in accordance with data obtained during operations performed before or after a process of acquiring the time series data sets, such as conditioning or cleaning of a chamber.

(3) Details of Processing (3) Performed in the Branch Section

Next, yet another processing performed in the branch section 710 will be described in detail. FIG. 10 is a third diagram illustrating a specific example of the processing performed in the branch section 710. In the case of FIG. 10, the branch section 710 inputs the same time series data sets acquired by the time series data acquiring devices 140_1 to 140_n to each of the fifth network section 720_5 and the sixth network section 720_6. In each of the fifth network section 720_5 and the sixth network section 720_6, a different process (normalization process) is applied to the same time series data sets.

Figure 11:
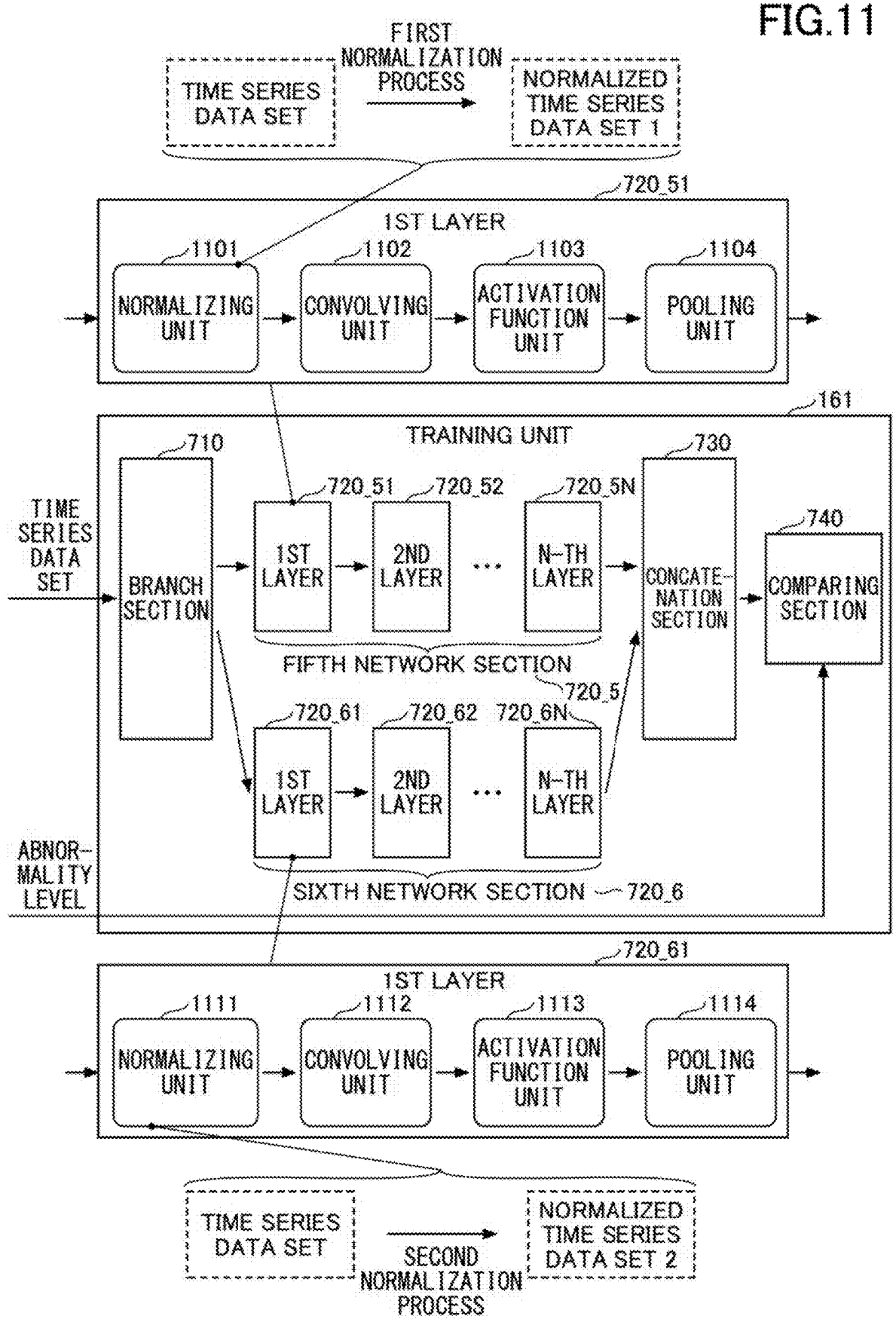
FIG. 11 is a diagram illustrating a specific example of processing performed by a normalizing unit included in each network section.

FIG. 11 is a diagram illustrating a specific example of processing performed by a normalizing unit included in each of the network sections. As illustrated in FIG. 11, each of the layers of the fifth network section 720_5 includes a normalizing unit, a convolving unit, an activation function unit, and a pooling unit.

The example of FIG. 11 illustrates a normalizing unit 1101, a convolving unit 1102, an activation function unit 1103, and a pooling unit 1104 included in the first layer 720_51 in the fifth network section 720_5.

Among these, the normalizing unit 1101 applies a first normalization process to the time series data sets that are input from the branch section 710, to generate the normalized time series data set 1 (first time series data set).

In addition, the example of FIG. 11 also illustrates a normalizing unit 1111, a convolving unit 1112, an activation function unit 1113, and a pooling unit 1114 included in the first layer 720_61 in the sixth network section 720_6.

Among these, the normalizing unit 1111 applies a second normalization process to the time series data sets that are input from the branch section 710, to generate the normalized time series data set 2 (second time series data set).

As described above, because the training unit 161 is configured to process time series data sets using multiple network sections each including a normalizing unit that performs normalization using a different method from other normalizing units, and because machine learning is performed on the above-described configuration, the unit of process 120 can be analyzed in a multifaceted manner. As a result, a model (inference unit 162) that achieves a high inference accuracy can be generated, as compared to a case in which a single type of normalization is applied to the time series data sets using a single network section.

(4) Details of Processing (4) Performed in the Branch Section

Next, still another processing performed in the branch section 710 will be described in detail. FIG. 12 is a fourth diagram illustrating a specific example of the processing performed in the branch section 710. In the example of FIG. 12, the branch section 710 inputs the time series data set 1 (first time series data set) measured along with processing of a wafer in the chamber A to the seventh network section 720_7, among the time series data sets measured by the time series data acquiring devices 140_1 to 140_n.

The branch section 710 inputs the time series data set 2 (second time series data set) measured along with the processing of the wafer in the chamber B to the eighth network section 720_8, among the time series data sets measured by the time series data acquiring devices 140_1 to 140_n.

As described above, because the training unit 161 is configured to process different time series data sets, each being measured along with processing in a different chamber (first processing space and second processing space), by using respective network sections, and because machine learning is performed on the above-described configuration, the unit of process 120 can be analyzed in a multifaceted manner. As a result, a model (inference unit 162) that achieves a high inference accuracy can be generated, as compared to a case in which each of the time series data sets is configured to be processed using a single network section.

<Functional Configuration of Inference Unit>

Figure 13:
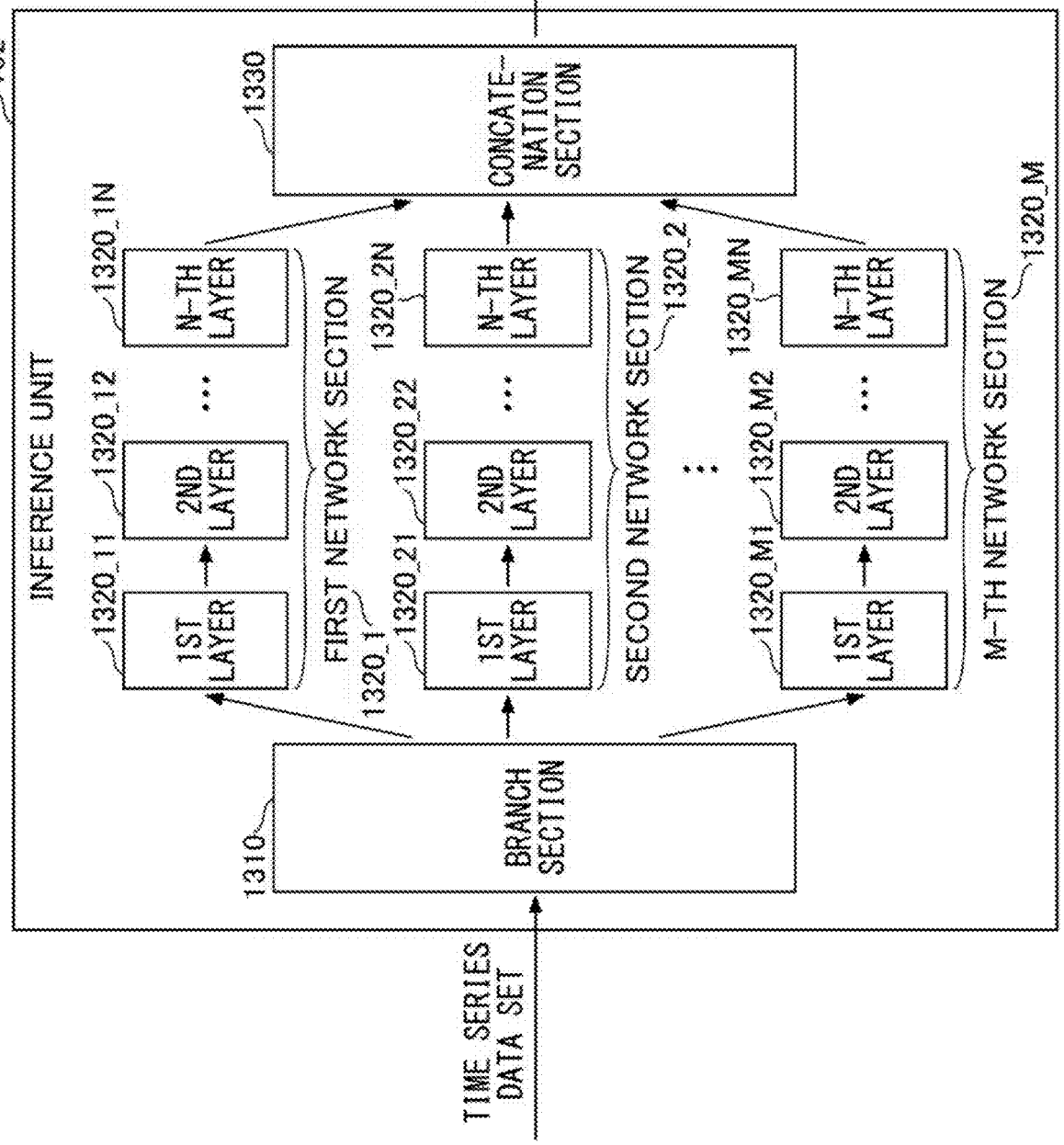
FIG. 13 is a first diagram illustrating an example of the functional configuration of an inference unit.

Next, the functional configuration of the inference unit 162 will be described. FIG. 13 is a first diagram illustrating an example of the functional configuration of the inference unit 162. As illustrated in FIG. 13, the inference unit 162 includes a branch section 1310, first to M-th network sections 1320_1 to 1320_M, and a concatenation section 1330.

The branch section 1310 acquires the time series data sets newly measured by the time series data acquiring devices 140_1 to 140_N after the time series data sets, which were used by the training unit 161 for machine learning, were measured. The branch section 1310 is also configured to cause the first to M-th network sections (1320_1 to 1320_M) to process the time series data sets acquired by the branch section 1310.

The first to M-th network sections (1320_1 to 1320_M) are implemented, by performing machine learning in the training unit 161 to optimize model parameters of each of the layers in the first to M-th network sections (720_1 to 720_M).

The concatenation section 1330 is implemented by the concatenation section 730 whose model parameters have been optimized by performing machine learning in the training unit 161. The concatenation section 1330 combines output data output from an N-th layer 1320_1N of the first network section 1320_1 to an N-th layer 1320_1N of the M-th network section 1320_M, to output the information indicating the degree of abnormality.

As described above, the inference unit 162 is generated by machine learning being performed in the training unit 161, which analyzes the time series data sets with respect to the predetermined unit of process 120 in a multifaceted manner. Thus, the inference unit 162 can also be applied to different process recipes, different chambers, and different devices. Alternatively, the inference unit 162 can be applied to a chamber before maintenance and to the same chamber after its maintenance. That is, the inference unit 162 according to the present embodiment eliminates the need, for example, to maintain or retrain a model after maintenance of a chamber is performed, which is required in conventional systems. Moreover, the model developed in the training unit 161 may be employed in the inference unit 162 to identify processes that will likely result in abnormalities of differing levels. In turn, by applying the trained model, the control of semiconductor manufacturing equipment may be controlled to trigger supervised or automated maintenance operations on a process chamber; adjustment of at least one of a RF power system (e.g., adjustment of RF power levels and/or RF waveform) for generating plasma or a gas input and/or gas exhaust operation, supervised or automated calibration operations (e.g., gas flow and/or RF waveforms for generating plasma, supervised or automated adjustment of gas flow levels, supervised or automated replacement of components such as electrostatic chuck, which may become wasted over time, and the like.

<Flow of Abnormality Detecting Process>

Figure 14:
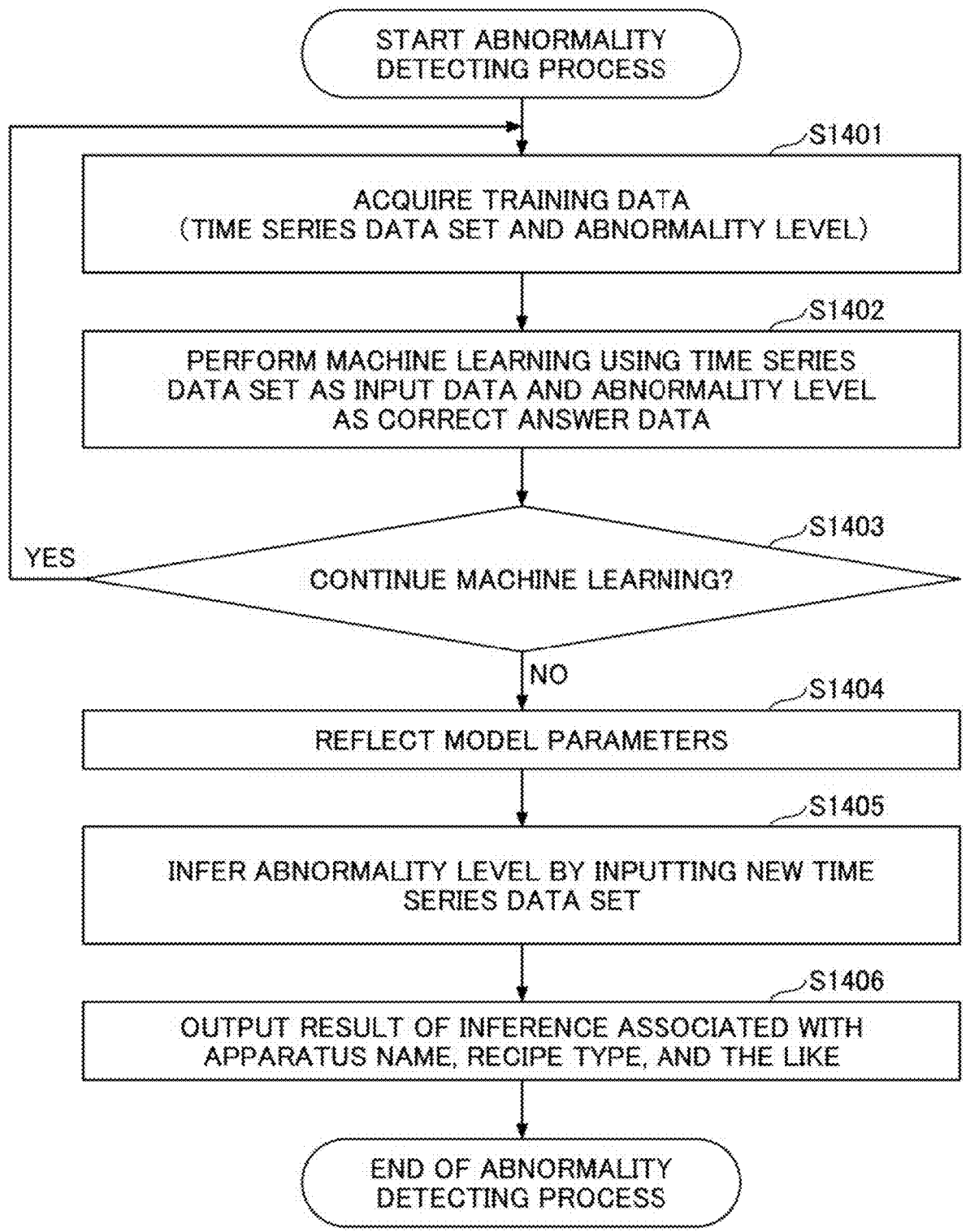
FIG. 14 is a first flowchart illustrating a flow of an abnormality detecting process.

Next, an overall flow of the abnormality detecting process performed by the abnormality detecting device 160 will be described. FIG. 14 is a first flowchart illustrating the flow of the abnormality detecting process.

In step S1401, the training unit 161 acquires time series data sets and information indicating an abnormality level, as training data.

In step S1402, the training unit 161 performs machine learning by using the acquired training data. Of the acquired training data, the time series data sets are used as input data, and the information indicating the abnormality level is used as correct answer data.

In step S1403, the training unit 161 determines whether to continue the machine learning. If machine learning is continued by acquiring further training data (in a case of YES in step S1403), the process returns to step S1401. Meanwhile, if the machine learning is terminated (in a case of NO in step S1403), the process proceeds to step S1404.

In step S1404, the inference unit 162 generates the first to M-th network sections 1320_1 to 1320_M by reflecting model parameters optimized by the machine learning.

In step S1405, the inference unit 162 infers the information indicating the abnormality level by inputting time series data sets measured along with the processing of a new wafer before processing.

In step S1406, the inference unit 162 outputs a result of inference, associated with an identifier indicating a corresponding semiconductor manufacturing device, an identifier indicating a corresponding type of process recipe, and the like.

<Summary>

As is apparent from the above description, the abnormality detecting device according to the first embodiment performs the following steps:
a) acquiring time series data sets measured along with processing of an object at a predetermined unit of process in the manufacturing process,
b) with respect to the acquired time series data sets,
   b-1) generating a first time series data set and a second time series data set by processing the acquired time series data sets in accordance with the first and second criteria respectively, processing the first and second time series data sets by using multiple network sections, and combining output data output from each of the multiple network sections,
   b-2) classifying the acquired time series data sets into multiple groups in accordance with data types or time ranges, processing the groups by using multiple network sections, and combining output data output from each of the multiple network sections, or
   b-3) inputting the acquired time series data sets to multiple network sections each performing normalization based on a different method, to process the acquired time series data sets in each of the multiple network sections, and combining output data output from each of the multiple network sections,
c) performing machine learning with respect to the multiple network sections, such that a result of the combining of the output data output from each of the multiple network sections approaches the information indicating abnormality level obtained when processing the object at the predetermined unit of process in the manufacturing process,
d) processing newly obtained time series data sets, which are measured by time series data acquiring devices along with processing of a new object, by using the multiple network sections to which a result of machine learning is applied, and outputting a result of combining output data output from each of the multiple network sections as inference information indicating abnormality level.

As described above, because the abnormality detecting device according to the first embodiment is configured to perform machine learning by inputting time series data sets to multiple network sections, the time series data sets of a predetermined unit of process in the semiconductor manufacturing process can be analyzed in a multifaceted manner. As a result, a model that realizes a high-precision abnormality detecting process can be generated, as compared to a case in which machine learning is performed by inputting time series data sets to a single network section.

That is, according to the first embodiment, an abnormality detecting device capable of performing a high-precision abnormality detecting process can be provided.

Second Embodiment

In the abnormality detecting device 160 according to the first example embodiment, with respect to the configuration in which acquired time series data sets are processed using multiple network sections, four types of configurations are illustrated. The second embodiment further describes, among these four configurations, a configuration in which time series data sets are processed using multiple network sections, each including a normalizing unit that performs normalization using a different method from other normalizing units. In the following description, a case in which
 a time series data acquiring device is an optical emission spectrometer, and
 time series data sets are optical emission spectroscopy data (hereinafter referred to as "OES data"), which are data sets including the number, corresponding to the number of types of wavelengths, of sets of time series data of emission intensity will be described.

Hereinafter, the second embodiment will be described focusing on the differences from the above-described first embodiment.

<Overall Configuration of a System Including a Device Performing a Semiconductor Manufacturing Process and an Abnormality Detecting Device>

Figure 15:
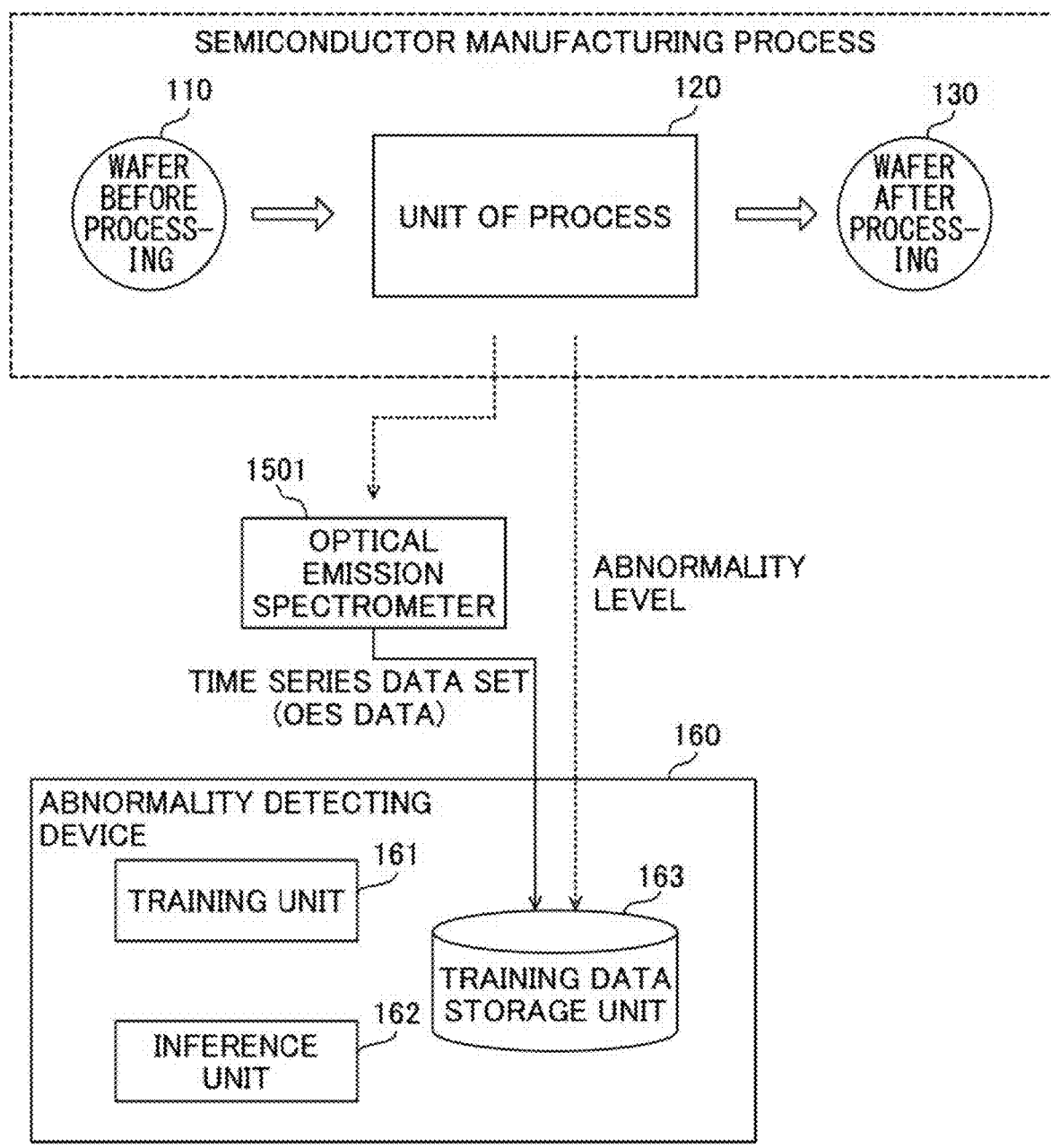
FIG. 15 is a second diagram illustrating an example of the overall configuration of the system including the device performing a semiconductor manufacturing process and the abnormality detecting device.

First, the overall configuration of a system including a device performing a semiconductor manufacturing process and an abnormality detecting device will be described, in which the time series data acquiring device in the system is an optical emission spectrometer. FIG. 15 is a second diagram illustrating an example of the overall configuration of the system including a device performing a semiconductor manufacturing process and the abnormality detecting device. As illustrated in FIG. 15, the system 1500 includes a device for performing a semiconductor manufacturing process, an optical emission spectrometer 1501, and the abnormality detecting device 160.

In the system 1500 illustrated in FIG. 15, by using optical emission spectroscopy, the optical emission spectrometer 1501 measures OES data as time series data sets, along with processing of a wafer before processing 110 at the unit of process 120. Part of the OES data measured by the optical emission spectrometer 1501 is stored in the training data storage unit 163 of the abnormality detecting device 160 as training data (input data) that is used when performing machine learning.

<Example of Training Data>

Next, the training data, which is read out from the training data storage unit 163 when the training unit 161 performs machine learning, will be described. FIG. 16 is a second diagram illustrating an example of the training data. As illustrated in FIG. 16, the training data 1600 includes items of information, which are similar to those in the training data 500 illustrated in FIG. 5. The difference from FIG. 5 is that the training data 1600 includes "OES DATA" as an item of information, instead of "TIME SERIES DATA SET" of FIG. 5, and OES data measured by the optical emission spectrometer 1501 is stored in the "OES DATA" field.

<Specific Example of OES Data>

Figure 17:
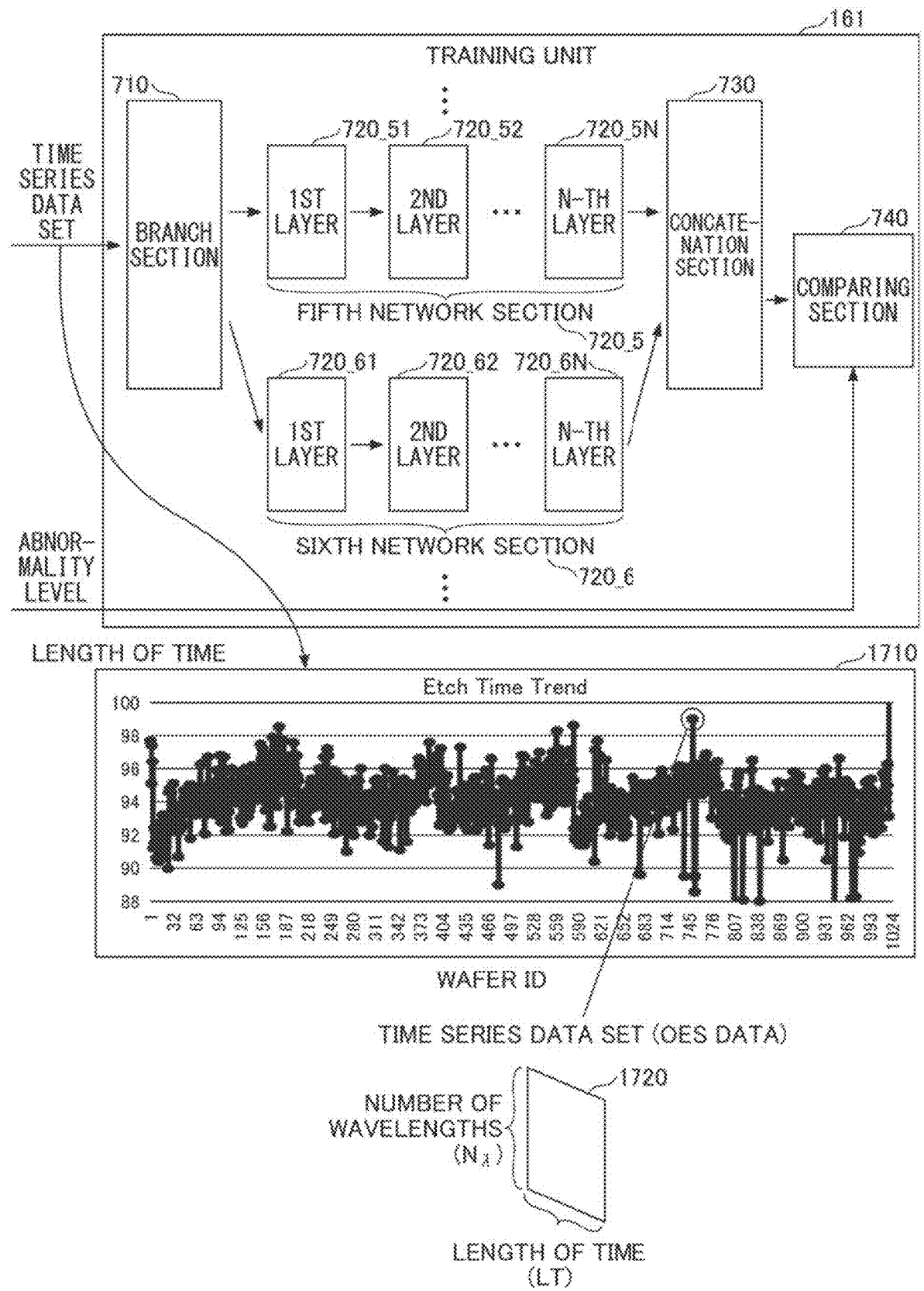
FIG. 17 is a diagram illustrating an example of optical emission spectrometer (OES) data.

Next, a specific example of the OES data measured in the optical emission spectrometer 1501 will be described. FIG. 17 is a diagram illustrating an example of OES data.

In FIG. 17, the graph 1710 is a graph illustrating characteristics of OES data, which is of time series data sets measured by the optical emission spectrometer 1501. The horizontal axis indicates a wafer identification number for identifying each wafer processed at the unit of process 120. The vertical axis indicates a length of time of the OES data measured in the optical emission spectrometer 1501 along with the processing of each wafer.

As illustrated in the graph 1710, the OES data measured in the optical emission spectrometer 1501 differs in length of time in each wafer to be processed.

In the example of FIG. 17, for example, OES data 1720 represents OES data measured along with the processing of a wafer before processing with wafer identification number="745". The vertical size (height) of the OES data 1720 depends on the wavelength range (number of wavelength components) measured in the optical emission spectrometer 1501. In the second embodiment, the optical emission spectrometer 1501 measures emission intensity within a predetermined wavelength range. Therefore, the vertical size of the OES data 1720 is, for example, the number of types of wavelength $N_\lambda$ ($N_\lambda$ is a natural number representing the number of wavelength components measured by the optical emission spectrometer 1501) included within the predetermined wavelength range. Note that, in the present embodiment, the number of wavelength components may also be referred to as the "number of wavelengths".

Meanwhile, the lateral size (width) of the OES data 1720 depends on the length of time over which optical emission spectrometer 1501 performs measurement. In the example of FIG. 17, the lateral size of the OES data 1720 is "LT".

Thus, the OES data 1720 can be said to be a set of time series data that groups together a predetermined number of wavelengths, where there is one-dimensional time series data of a predetermined length of time for each of the wavelengths.

When the OES data 1720 is input to the fifth network section 720_5 and the sixth network section 720_6, the branch section 710 resizes the data on a per minibatch basis, such that the data size is the same as that of the OES data of other wafer identification numbers.

<Example of Normalization Part Processing>

Next, a specific example of processing performed by the normalizing units in the fifth network section 720_5 and the sixth network section 720_6, into each of which the OES data 1720 is input from the branch section 710, will be described.

Figure 18:
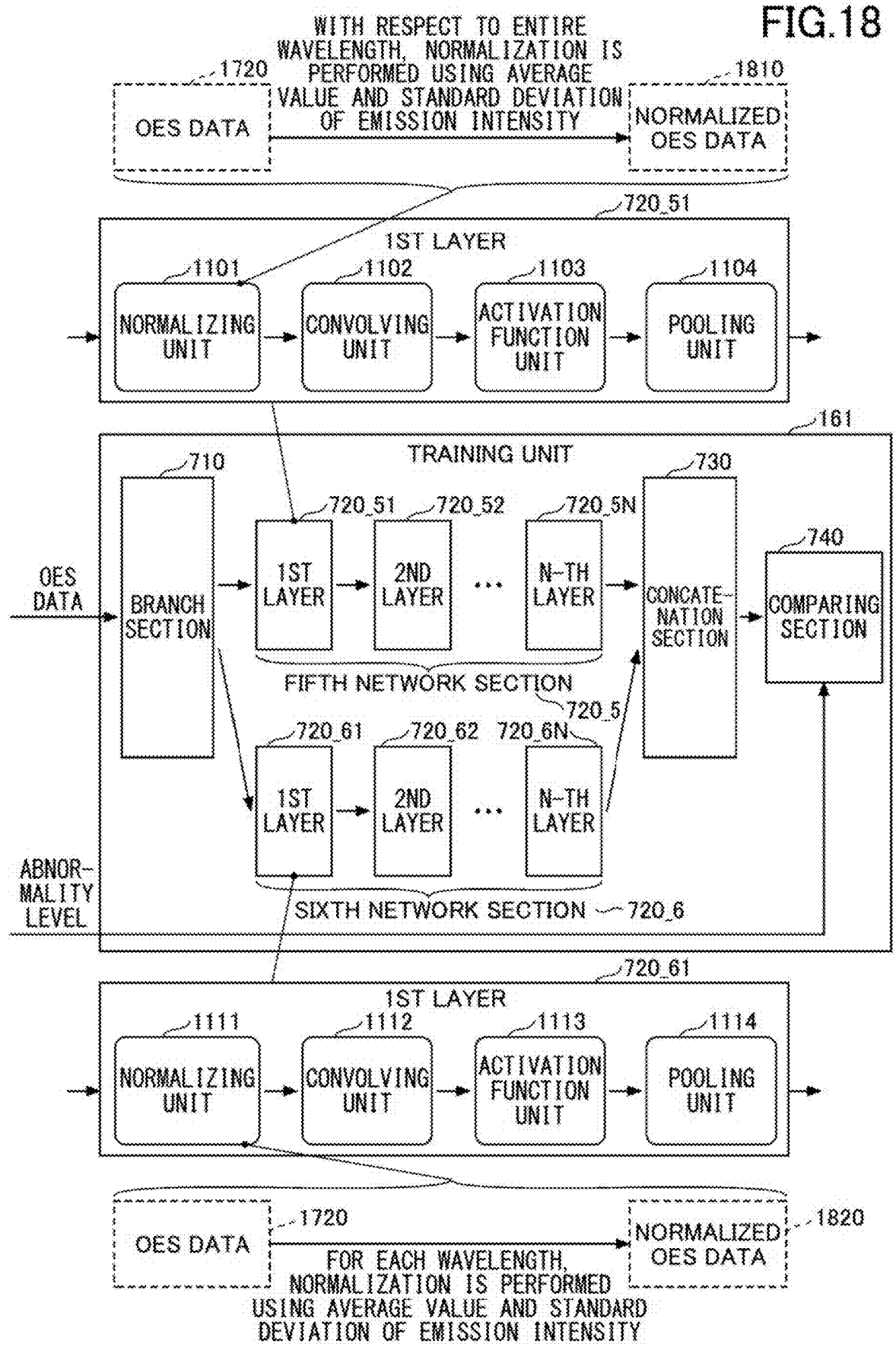
FIG. 18 is a diagram illustrating a specific example of processing performed by normalizing units included in the respective network sections into which OES data is input.

FIG. 18 is a diagram illustrating a specific example of the processing performed by the normalizing units included in the respective network sections into which OES data is input. As illustrated in FIG. 18, among layers included in the fifth network section 720_5, the first layer 720_51 includes the normalizing unit 1101. The normalizing unit 1101 generates normalized data (normalized OES data 1810) by normalizing the OES data 1720 using a first method (normalization based on an average value and a standard deviation of the emission intensity is applied with respect to the entire wavelength).

As illustrated in FIG. 18, among layers included in the sixth network section 720_6, the first layer 720_61 includes the normalizing unit 1111. The normalizing unit 1111 generates normalized data (normalized OES data 1820) by normalizing the OES data 1720 using a second method (normalization based on an average value and a standard deviation of the emission intensity is applied to each wavelength).

Figure 19A:
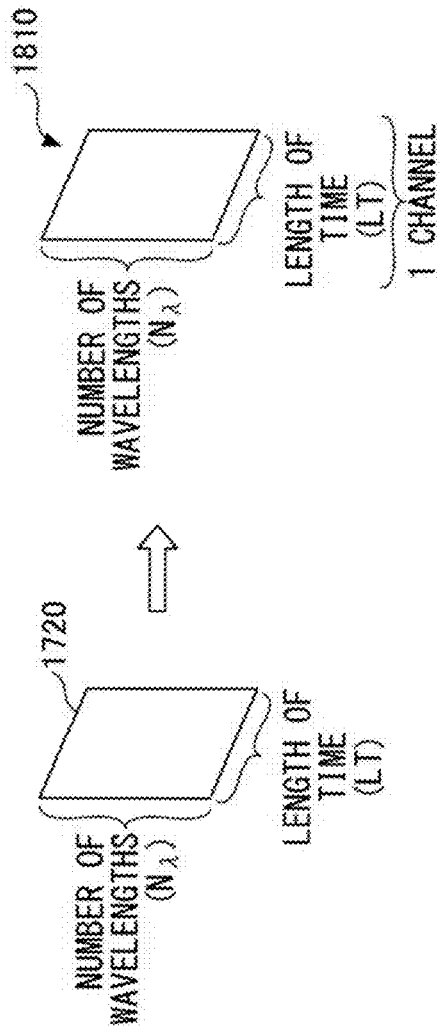
FIGS. 19A and 19B are diagrams illustrating specific examples of processing of each of the normalizing units.
Figure 19B:
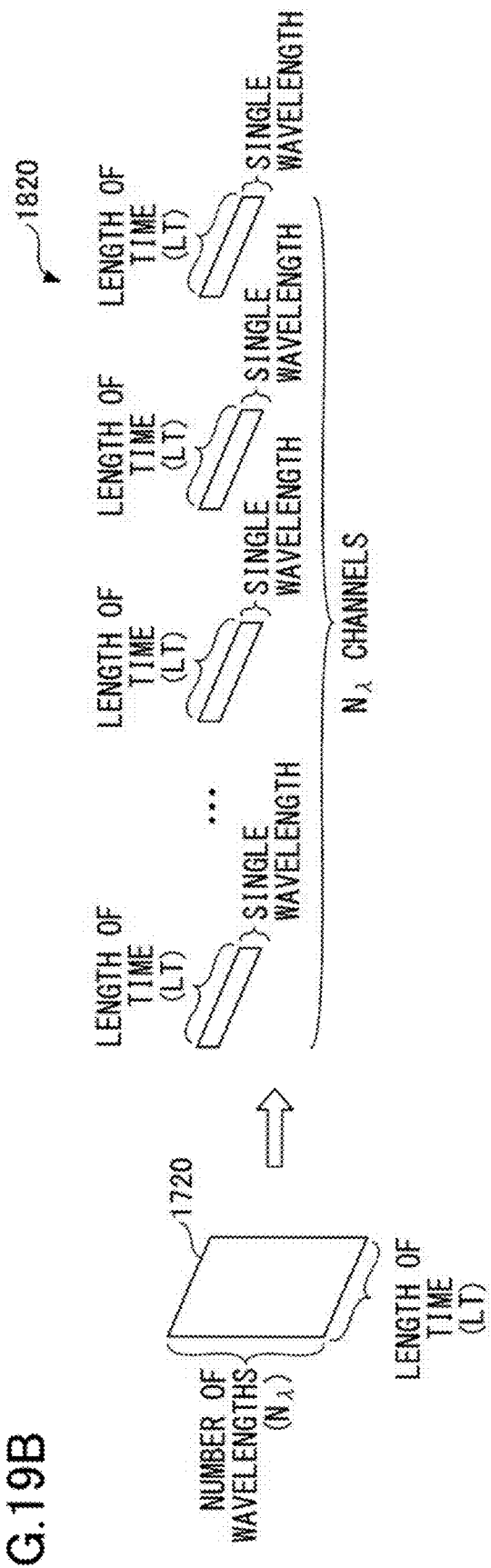

FIGS. 19A and 19B are diagrams illustrating specific examples of processing of each of the normalizing units. FIG. 19A illustrates the processing of the normalizing unit 1101. As illustrated in FIG. 19A, in the normalizing unit 1101, normalization is performed with respect to the entire wavelength using the mean and standard deviation of the emission intensity. Meanwhile, FIG. 19B illustrates the processing of the normalizing unit 1111. In the normalizing unit 1111, normalization using the average and the standard deviation of the emission intensity is applied to each wavelength.

Thus, even though the same OES data 1720 is used, information that will be found out from the same OES data 1720 differs depending on what is used as a reference (i.e., depending on analysis methods). The abnormality detecting device 160 according to the second embodiment causes different network sections, each of which is configured to perform different normalization, to process the same OES data 1720. Thus, by combining multiple normalization processes, it is possible to analyze the OES data 1720 in the unit of process 120 in a multifaceted manner. As a result, a model (inference unit 162) that realizes the high inference accuracy can be generated, as compared to a case in which a single type of normalization process is applied to the OES data 1720 using a single network section.

The above-described example describes a case in which normalization is performed using an average value of emission intensity and a standard deviation of emission intensity. However, a statistical value used for normalization is not limited thereto. For example, the maximum value and a standard deviation of emission intensity may be used for normalization, or other statistics may be used. In addition, the abnormality detecting device 160 may be configured such that a user can select types of a statistical value to be used for normalization.

<Example of Process Performed in Pooling Unit>

Figure 20:
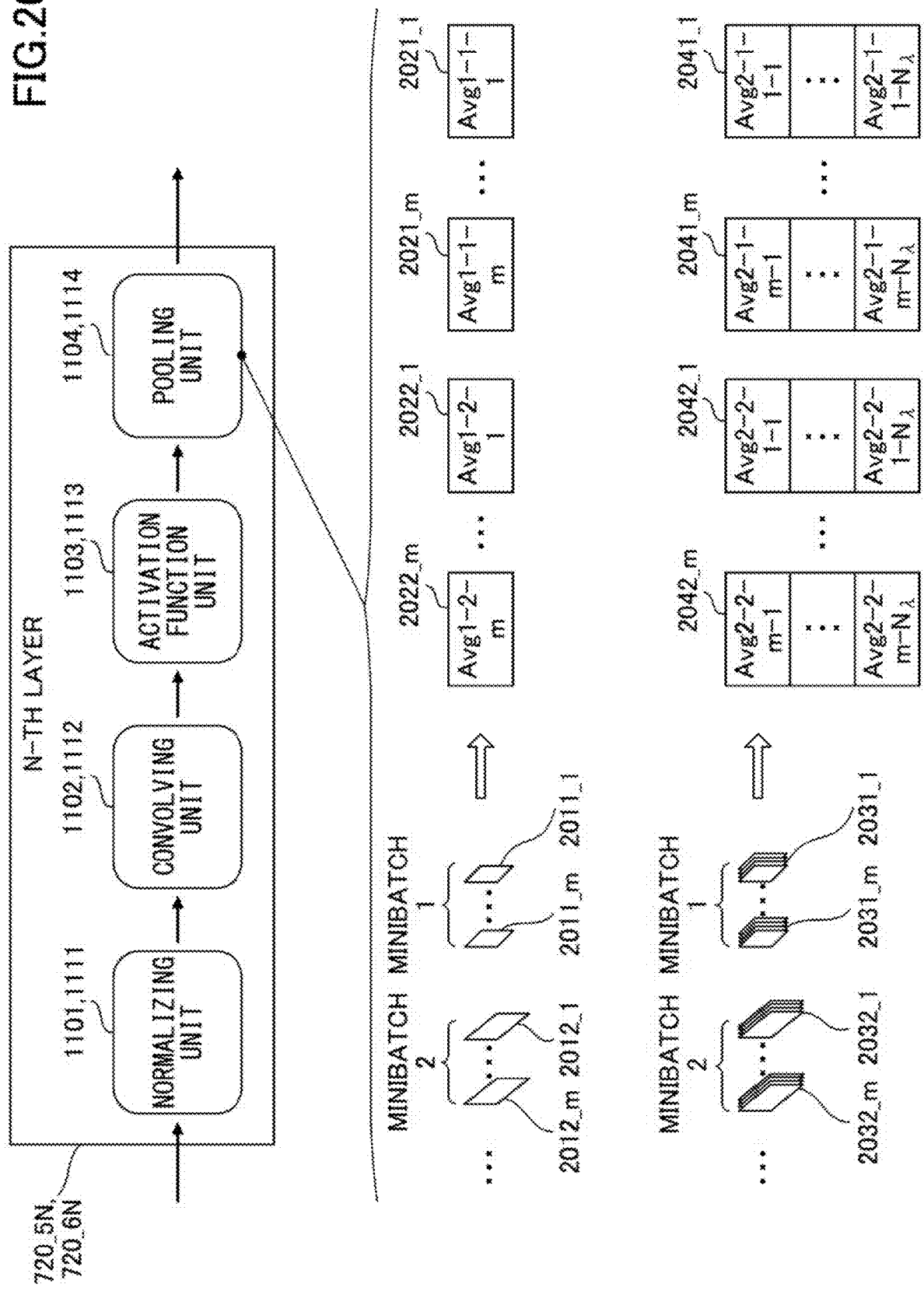
FIG. 20 is a diagram illustrating a specific example of processing performed by pooling units.

Next, a specific example of the processing performed by the pooling units included in the final layer of the fifth network section 720_5 and in the final layer of the sixth network section 720_6 will be described. FIG. 20 is a diagram illustrating the specific example of the processing performed by the pooling units.

Because data size differs between minibatches, the pooling units 1104 and 1114 included in the respective final layers of the fifth network section 720_5 and the sixth network section 720_6 perform pooling processes such that fixed-length data is output between minibatches (i.e., size of output data according to each minibatch becomes the same).

FIG. 20 is a diagram illustrating a specific example of the processing performed in the pooling units. As illustrated in FIG. 20, the pooling units 1104 and 1114 apply global average pooling (GAP) processing to feature data that is output from the activation function units 1103 and 1113.

In FIG. 20, feature data $2011\_1$ to $2011\_m$ represent feature data generated based on the OES data belonging to the minibatch 1, and are input to the pooling unit 1104 of the N-th layer 720_5N of the fifth network section 720_5. Each of the feature data $2011\_1$ to $2011\_m$ represents feature data corresponding to one channel.

Feature data 2012_1 to 2012_m represent feature data generated based on the OES data belonging to the minibatch 2, and are input to the pooling unit 1104 of the N-th layer 720_5N of the fifth network section 720_5. Each of the feature data 2012_1 to 2012_m represents feature data corresponding to one channel.

Also, feature data 2031_1 to 2031_m and feature data 2032_1 to 2032_m are similar to the feature data 2011_1 to 2011_m or the feature data 2012_1 to 2012_m. However, each of the feature data 2031_1 to 2031_m and 2032_1 to 2032_m is feature data corresponding to Nx channels.

Here, the pooling units 1104 and 1114 calculate an average value of feature values included in the input feature data on a per channel basis, to output the fixed-length output data. Thus, the data output from the pooling units 1104 and 1114 can have the same data size between minibatches.

<Functional Configuration of Inference Unit>

Figure 21:
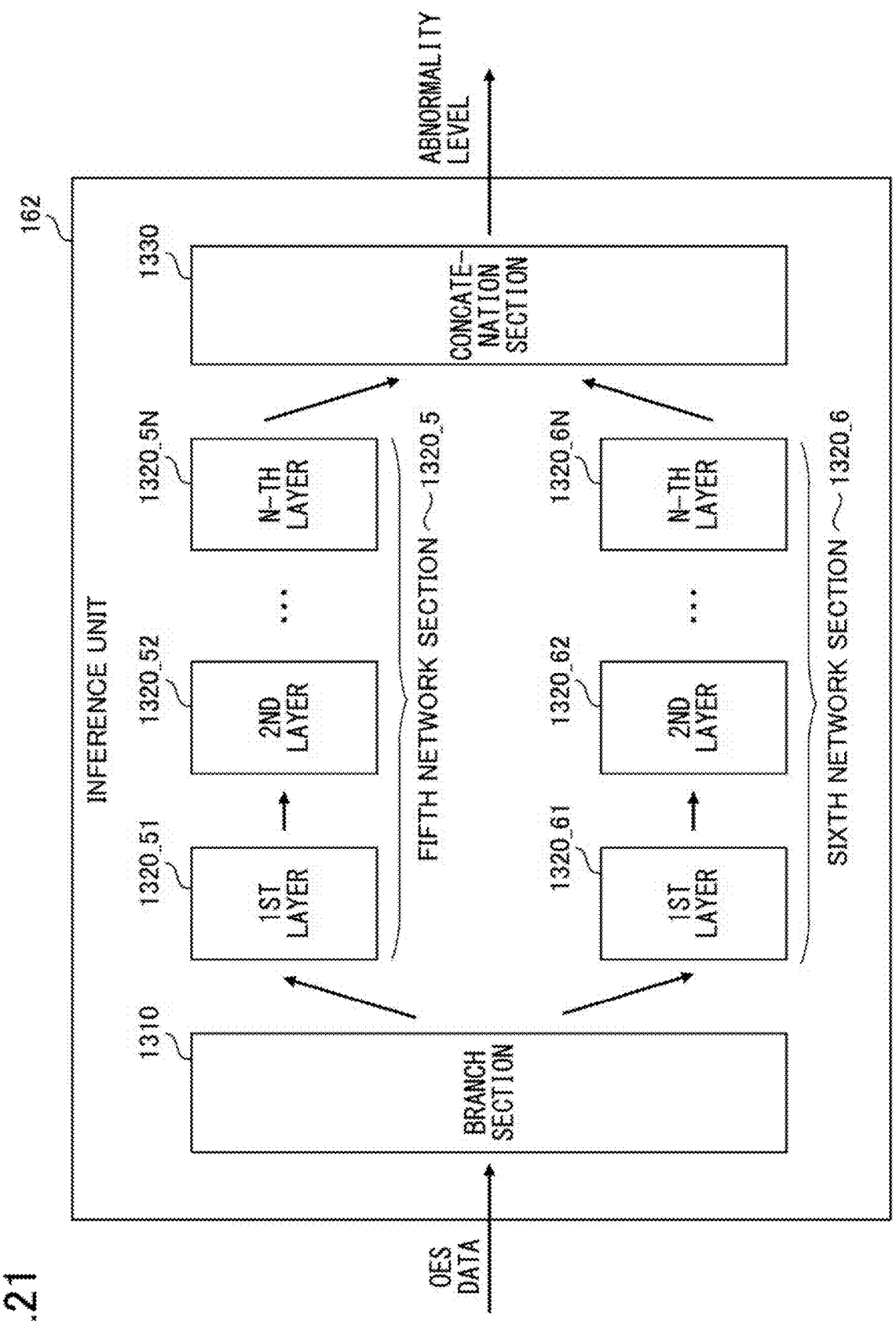
FIG. 21 is a second diagram illustrating an example of the functional configuration of the inference unit.

Next, the functional configuration of the inference unit 162 will be described. FIG. 21 is a second diagram illustrating an example of the functional configuration of the inference unit 162. As illustrated in FIG. 21, the inference unit 162 includes a branch section 1310, a fifth network section 1320_5, a sixth network section 1320_6, and a concatenation section 1330.

The branch section 1310 acquires OES data newly measured by the optical emission spectrometer 1501, after the OES data used by the training unit 161 for machine learning, was measured. The branch section 1310 is also configured to cause both the fifth network section 1320_5 and the sixth network section 1320_6 to process the same acquired OES data.

The fifth network section 1320_5 and the sixth network section 1320_6 are implemented, by performing machine learning in the training unit 161 to optimize model parameters of each of the layers in the fifth network section 720_5 and the sixth network section 720_6.

The concatenation section 1330 is implemented by the concatenation section 730 whose model parameters have been optimized by performing machine learning in the training unit 161. The concatenation section 1330 combines output data that is output from an N-th layer 1320_5N of the fifth network section 1320_5 and from an N-th layer 1320_6N of the sixth network section 1320_6, to output information indicating a degree of abnormality.

As described above, the inference unit 162 is generated by machine learning being performed in the training unit 161, which analyzes the OES data with respect to the predetermined unit of process 120 in a multifaceted manner. Thus, the inference unit 162 can also be applied to different process recipes, different chambers, and different devices. Alternatively, the inference unit 162 can be applied to a chamber before maintenance and to the same chamber after its maintenance. That is, the inference unit 162 according to the present embodiment eliminates the need, for example, to maintain or retrain a model after performing maintenance on the chamber, which is required in conventional systems.

<Flow of Abnormality Detecting Process>

Figure 22:
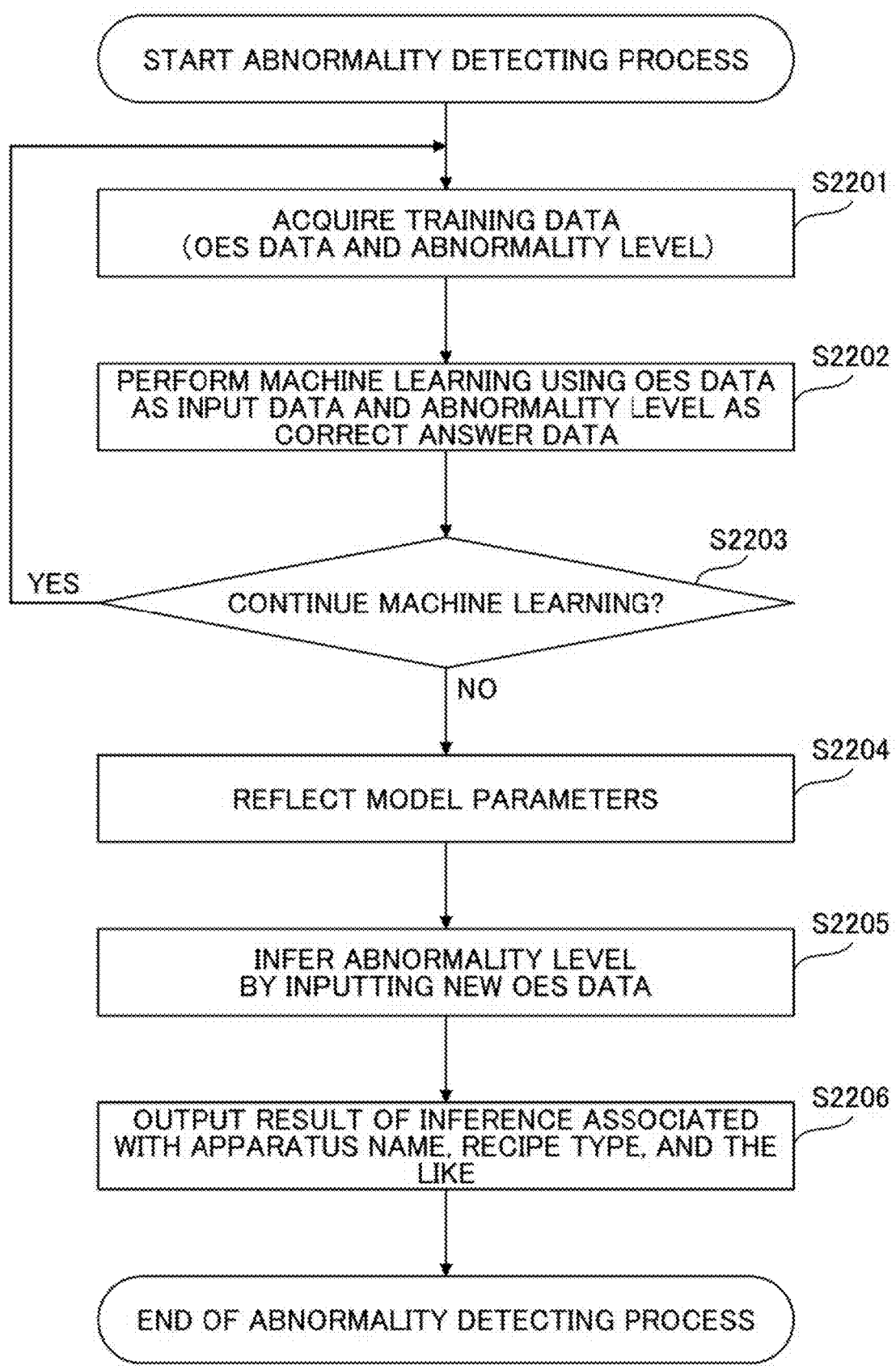
FIG. 22 is a second flowchart illustrating the flow of the abnormality detecting process.

Next, an overall flow of the abnormality detecting process performed by the abnormality detecting device 160 will be described. FIG. 22 is a second flowchart illustrating the flow of the abnormality detecting process.

In step S2201, the training unit 161 acquires OES data and information indicating an abnormality level, as training data.

In step S2202, the training unit 161 performs machine learning by using the acquired training data. Specifically, the OES data in the acquired training data is used as input data, and the information indicating the abnormality level in the acquired training data is used as correct answer data.

In step S2203, the training unit 161 determines whether to continue the machine learning. If machine learning is continued by acquiring further training data (in a case of YES in step S2203), the process returns to step S2201. Meanwhile, if the machine learning is terminated (in a case of NO in step S2203), the process proceeds to step S2204.

In step S2204, the inference unit 162 generates the fifth network section 1320_5 and the sixth network section 1320_6 by reflecting model parameters optimized by the machine learning.

In step S2205, the inference unit 162 infers the information indicating the abnormality level by inputting OES data measured by the optical emission spectrometer 1501 along with the processing of a new wafer before processing.

In step S2206, the inference unit 162 outputs a result of inference, associated with an identifier indicating a corresponding semiconductor manufacturing device, an identifier indicating a corresponding process recipe, and the like.

<Summary>

As is apparent from the above description, the abnormality detecting device according to the second embodiment performs the following steps:

acquiring OES data measured by an optical emission spectrometer, along with processing of an object at a given unit of process in a manufacturing process;

inputting the acquired OES data to two network sections each of which performs normalization using a different method from each other;

combining output data output from each of the two network sections;

performing machine learning with respect to the two network sections such that a result of the combining of the output data output from each of the two network sections approaches information indicating an abnormality level obtained during the processing of the object at the predetermined unit of process in the manufacturing process;

processing OES data measured along with processing of a new object by the optical emission spectrometer, by using the two network sections to which machine learning has been applied; and inferring information indicating an abnormality level, by outputting a result of combining output data output from each of the two network sections to which machine learning has been applied.

As described above, because the abnormality detecting device according to the second embodiment is configured to perform machine learning by inputting OES data to two network sections, the OES data of a predetermined unit of process in the semiconductor manufacturing process can be analyzed in a multifaceted manner. As a result, a model that realizes a high-precision abnormality detecting process can be generated, as compared to a case in which machine learning is performed by inputting OES data to a single network section.

That is, according to the second embodiment, an abnormality detecting device capable of performing a high-precision abnormality detecting process can be provided.

Third Embodiment

In the second embodiment, as an example of a time series data acquiring device, an optical emission spectrometer is described. However, types of the time series data acquiring device applicable to the first embodiment are not limited to the optical emission spectrometer.

For example, examples of the time series data acquiring device described in the first embodiment may include a process data acquiring device that acquires various process data, such as temperature data, pressure data, or gas flow rate data, as one-dimensional time series data. Alternatively, the time series data acquiring device described in the first embodiment may include a radio-frequency (RF) power supply device for plasma configured to acquire various RF data, such as voltage data of the RF power supply, as one-dimensional time series data.

Although the above-described first and second embodiments do not mention any specific type of abnormality, any type of abnormality may be included as the type of abnormality that occurs in the unit of process 120. Types of abnormalities that occur in the unit of process 120 may include, for example, abnormalities caused by aging and abnormalities occurring unexpectedly.

Examples of the abnormalities caused by aging include abnormalities occurring in the result, such as abnormalities in wafer thickness or etch rate. Examples of the abnormalities caused by aging may also include aging of parts in the semiconductor manufacturing device and aging of equipment connected to the semiconductor manufacturing device, such as abrasion of parts, abrasion of electrodes, deterioration of the equipment, and deposition of films on parts in the semiconductor manufacturing device. In addition, examples of the abnormalities caused by aging may include abnormalities caused by aging of parts in the semiconductor manufacturing device or caused by aging of equipment connected to the semiconductor manufacturing device, such as fluctuations in a gas flow rate, or abnormalities in temperature.

Meanwhile, examples of the abnormalities occurring unexpectedly include abnormal discharging, droplets (an event in which a large number of micron-sized particles are deposited), unstable behavior of discharging, and air or helium leakage.

In the above-described first and second embodiments, information indicating an abnormality level is stored as training data (correct answer data). However, instead of the information indicating the abnormality level, information indicating the presence or absence of an abnormality (i.e., result of comparing the information indicating the abnormality level with a predetermined threshold value) may be stored as training data (correct answer data). In this case, the training unit 161 performs machine learning so that output of the training unit 161 coincides with the presence or absence of an abnormality included in the training data, and the inference unit 162 infers the presence or absence of abnormality.

Alternatively, the training unit 161 may perform mechanical learning as described in the above-described first and second embodiments, and the inference unit 162 may be configured to convert the information indicating the abnormality level output from the concatenation section 1330 into information indicating the presence or absence of an abnormality, to output the presence or absence of an abnormality as a result of inference.

For example, a sigmoid function may be used for converting information indicating abnormality level to information indicating the presence or absence of an abnormality. Specifically, the inference unit 162 may input information indicating the abnormality level to a sigmoid function, and if output of the sigmoid function when inputting the information indicating the abnormality level is equal to or greater than 0.5, the inference unit 162 may output "abnormal" as the information indicating the presence or absence of an abnormality. Conversely, if the output of the sigmoid function when inputting the information indicating the abnormality level is smaller than 0.5, the inference unit 162 may output "no abnormality" as the information indicating the presence or absence of an abnormality.

In the above-described first and second embodiments, the training unit is described as performing machine learning using the same training data regardless of the type of abnormality. However, the method of machine learning performed by the training unit is not limited thereto, and the training unit may be configured to perform machine learning using different training data depending on the type of abnormality. Specifically, for example, the training unit may be configured to include:

a first set of network sections to which machine learning is applied such that information indicating the presence of an abnormality is output when abnormal discharging occurs, and a second set of network sections separate from the first set of network sections, to which machine learning is applied such that information indicating the presence of an abnormality is output when droplets occur. Also, machine learning with respect to the first set of network sections may be performed by using training data different from that used for machine learning with respect to the second set of network sections.

Also, in the abnormality detecting device 160 according to the first and second embodiments described above, the training unit performs machine learning so that information indicating the degree of abnormality is output regardless of the types of abnormality that have occurred.

However, the method of machine learning performed by the training unit is not limited thereto, and the training unit may be configured to perform machine learning such that information indicating the type of abnormality is output in addition to the information indicating the degree of abnormality. Specifically, the concatenation section may be provided with the same number of output sections as number of types of abnormality. Each of the output sections may be associated with a corresponding type of abnormality, and may be configured to output a degree of certainty of occurrence of the corresponding type of abnormality.

Other Embodiments

The above-described first to third embodiments have been described such that a machine learning algorithm for each of the network sections in the training unit 161 is configured based on a convolutional neural network. However, the machine learning algorithm for each of the network sections in the training unit 161 is not limited to the convolutional neural network, and may be based on other machine learning algorithms.

In the first to third embodiments described above, it has been described that the abnormality detecting device 160 functions as the training unit 161 and the inference unit 162. However, an apparatus serving as the training unit 161 needs not be integrated with an apparatus serving as the inference unit 162, and an apparatus serving as the training unit 161 and an apparatus serving as the inference unit 162 may be provided separately. That is, the abnormality detecting device 160 may function as the training unit 161 without including the inference unit 162, or the abnormality detecting device 160 may function as the inference unit 162 without including the training unit 161.

It should be noted that the present invention is not limited to the above-described configurations, such as configurations described in the embodiments described above, or configurations combined with other elements. Configurations may be changed to an extent not departing from the spirit of the invention, and can be appropriately determined in accordance with their application forms.

What is claimed is:

1. An abnormality detecting device comprising:
processing circuitry; and
a non-transitory computer readable medium that has stored therein a computer program that, when executed by the processing circuitry, configures the processing circuitry to
acquire one or more time series data sets measured along with processing of a substrate at a predetermined unit of process in a manufacturing process of the substrate, the one or more time series data sets being time series data sets measured during processing in a substrate processing apparatus, the time series data sets including at least one of
time series data of plasma emission intensity,
time series data of temperature, pressure and gas flow, or
time series data of radio frequency (RF) power or RF voltage, and other RF-related data associated with an operation of the substrate processing apparatus, and
apply the one or more time series data sets in a neural network to develop a trained model, the neural network including
a plurality of network sections each configured to process the acquired time series data sets, and
a concatenation section configured to combine output data output from each of the plurality of network sections as a result of processing the acquired time series data sets, and to output, as a combined result, a result of combining the output data output from each of the plurality of network sections, and
compare the combined result with an abnormality level to train the trained model such that the combined result output from the concatenation section progressively approaches information indicating the abnormality level, the abnormality level includes both gradual temporal abnormalities and sudden abnormalities in the manufacturing process of the substrate, wherein
each of the plurality of network sections includes a first data processing layer and a second data processing layer,
the first data processing layer extracts multiple features from the time series data sets,
the second data processing layer
processes the extracted multiple features such that a data size corresponds to a data size of each minibatch, a feature data size differs between minibatches and is determined according to an object being processed, substrate processing conditions for the object being processed, and substrate measurement conditions, and
outputs data of a same size to the concatenation section, and each minibatch includes one or more time series data sets.

2. The abnormality detecting device according to claim 1, wherein the processing circuitry is further configured to
apply the trained model to infer information indicating the abnormality level when a new object is processed, application of the trained model including
process one or more time series data sets acquired with respect to the new object at the plurality of the network sections,
generate, at the concatenation section, a combined result of output data output from each of the plurality of network sections, and
infer the information indicating the abnormality level, when the new object is processed, as the combined result generated by the concatenation section.

3. The abnormality detecting device according to claim 2, wherein the processing circuitry is further configured to output information indicating a presence or an absence of abnormality, based on the information inferred as an indication of the abnormality level when the new object is processed.

4. The abnormality detecting device according to claim 1, wherein
the neural network is a convolutional neural network (CNN), and
the processing circuitry is further configured to apply the trained model to adapt a unit of process performed during manufacture of a processed object.

5. The abnormality detecting device according to claim 1, wherein the processing circuitry is further configured to
generate a first time series data set by processing the acquired one or more time series data sets in accordance with a first criterion;
generate a second time series data set by processing the acquired one or more time series data sets in accordance with a second criterion;
cause a first network section of the plurality of network sections to process the first time series data set; and
cause a second network section of the plurality of network sections to process the second time series data set.

6. The abnormality detecting device according to claim 5, wherein the processing circuitry is further configured to
infer information indicating an abnormality level associated with a new object to be processed,
generate a first time series data set with respect to the new object, by processing one or more time series data sets acquired with respect to the new object in accordance with the first criterion,
generate a second time series data set with respect to the new object, by processing the time series data sets acquired with respect to the new object in accordance with the second criterion;
process the time series data sets acquired with respect to the new object at the plurality of the network sections during the application of the trained model;
generate, at the concatenation section of the trained model, a combined result by combining the output data output from each of the plurality of network sections during application of the trained model, and
infer the information indicating the abnormality level when the new object is processed, by outputting the combined result generated by the concatenation section, wherein,
during application of the trained model, a first network section of the plurality of network sections is caused to process the first time series data set, and a second network section of the plurality of network sections is caused to process the second time series data set.

7. The abnormality detecting device according to claim 1, wherein the processing circuitry is further configured to
classify the acquired time series data sets into a plurality of groups, in accordance with a data type or a time range; and cause each of the plurality of network sections to process a corresponding group from among the plurality of groups.

8. The abnormality detecting device according to claim 7, wherein during application of the trained model, the processing circuitry is further configured to
infer information indicating an abnormality level associated with a new object to be processed,
classify one or more time series data sets acquired with respect to the new object into a plurality of groups, in accordance with the data type or the time range;
process the plurality of groups at the plurality of the network sections;
generate, at the concatenation section, a combined result by combining the output data output from each of the plurality of network sections, and
infer the information indicating the abnormality level by outputting the combined result generated by the concatenation section.

9. The abnormality detecting device according to claim 1, wherein
the plurality of network sections are each configured to normalize the acquired time series data sets using a different method from each other; and
each of the plurality of network sections is configured to process the time series data sets after being normalized from among the normalizing units.

10. The abnormality detecting device according to claim 9, during application of the trained model, the processing circuitry is further configured to
infer information indicating an abnormality level, when a new object is processed,
process one or more time series data sets acquired with respect to the new object at the plurality of the network sections;
generate, at the concatenation section a combined result by combining the output data output from each of the plurality of network sections; and
infer the information indicating the abnormality level when the new object is processed, by outputting the combined result generated by the concatenation section.

11. The abnormality detecting device according to claim 1, wherein
the acquired time series data sets include a first time series data set measured along with processing of the object in a first processing space and a second time series data set measured along with processing of the object in a second processing space, the processing in the first processing space and the processing in the second processing space being included in the predetermined unit of process; and
the processing circuitry is further configured to cause the first time series data set to be processed at a first network section of the plurality of network sections, and to cause the second time series data set to be processed at a second network section of the plurality of network sections, the second network section being different from the first network section.

12. The abnormality detecting device according to claim 11, during application of the trained model, the processing circuitry is further configured to
process one or more time series data sets acquired with respect to a new object at the plurality of the network sections, the time series data sets acquired with respect to the new object including a first time series data set with respect to the new object measured along with the processing in the first processing space, and including a second time series data set with respect to the new object measured along with the processing in the second processing space;
generate, at the concatenation section a combined result by combining the output data output from each of the plurality of network sections to which the machine learning has been applied; and
infer the information indicating the abnormality level when the new object is processed, by outputting the combined result generated by the concatenation section.

13. The abnormality detecting device according to claim 1, wherein the time series data sets are data measured along with processing in a substrate processing apparatus.

14. The abnormality detecting device according to claim 1, wherein the processing circuitry is configured to perform machine learning with respect to the plurality of network sections and the concatenation section, such that the combined result output from the concatenation section approaches information indicating a type of abnormality acquired when the object is processed at the predetermined unit of process in the manufacturing process, in addition to the information indicating an abnormality level.

15. The abnormality detecting device according to claim 9, wherein the time series data sets are data measured by an optical emission spectrometer, along with processing in a substrate processing apparatus, the data indicating emission intensity of each wavelength.

16. The abnormality detecting device according to claim 15, wherein
a first network section of the plurality of network sections is configured to perform normalization with respect to an entire wavelength, using a statistical value of the emission intensity.

17. The abnormality detecting device according to claim 15, wherein
a second network section of the plurality of network sections is configured to perform normalization for each wavelength, using a statistical value of the emission intensity.

18. The abnormality detecting device according to claim 4, wherein the processing circuitry is further configured to adapt the unit of process by controlling execution of at least one of
a maintenance operation on a process chamber,
a calibration operation on the process chamber or a component in the process chamber,
an adjustment of power level or waveform of RF energy applied within the process chamber used to generate plasma, or
chuck replacement.

19. A computer-implemented method of detecting abnormality comprising:
acquiring one or more time series data sets measured along with processing of a substrate at a predetermined unit of process in a manufacturing process of the substrate, the one or more time series data sets being time series data sets measured during processing in a substrate processing apparatus, the time series data sets including at least one of
time series data of plasma emission intensity,
time series data of temperature, pressure and gas flow, or
time series data of radio frequency (RF) power or RF voltage, and other RF-related data associated with an operation of the substrate processing apparatus;

performing machine learning on processing circuitry to implement a plurality of network sections and a concatenation section of a neural network, each of the plurality of network sections being configured to process the acquired time series data sets and to output output data as a result of processing the acquired time series data sets, and the concatenation section being configured to combine the output data output from each of the plurality of network sections and to output, as a combined result, a result of combining the output data output from each of the plurality of network sections, wherein the machine learning is performed to train a trained model such that the combined result output from the concatenation section approaches information indicating an abnormality level acquired when the object is processed at the predetermined unit of process in the manufacturing process, the abnormality level includes both gradual temporal abnormalities and sudden abnormalities in the manufacturing process of the substrate, wherein each of the plurality of network sections includes a first data processing layer and a second data processing layer, the first data processing layer performs extracting multiple features from the time series data sets, the second data processing layer performs processing the extracted multiple features such that a data size corresponds to a data size of each minibatch, a feature data size differs between minibatches and is determined according to an object being processed, substrate processing conditions for the object being processed, and substrate measurement conditions, and outputs data of a same size to the concatenation section, and each minibatch includes one or more time series data sets.

20. The method according to claim 19, further comprising applying the trained model during the manufacturing process to adapt an operation of the predetermined unit of process according to the abnormality level inferred by the trained model based on the predetermined unit of process; wherein the neural network is a convolutional neural network (CNN), and the applying includes at least one of performing a maintenance operation on a process chamber, calibrating a component in the process chamber, adjusting a power level or waveform of RF energy applied within the process chamber used to generate plasma, or replacing a chuck that holds the object.

* * * * *